(12) United States Patent
Glavin et al.

(10) Patent No.: US 12,611,732 B2
(45) Date of Patent: *Apr. 28, 2026

(54) PROCESS OF MAKING COMPONENTS FOR ELECTRONIC AND OPTICAL DEVICES USING LASER PROCESSING ON A PATTERNED CONDUCTIVE FILM

(71) Applicant: Government of the United States, as represented by the Secretary of the Air Force, Wright-Patterson AFB, OH (US)

(72) Inventors: Nicholas R. Glavin, Springboro, OH (US); Christopher Muratore, Kettering, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 1147 days.

This patent is subject to a terminal disclaimer.

(21) Appl. No.: 17/336,894

(22) Filed: Jun. 2, 2021

(65) Prior Publication Data

US 2021/0299789 A1 Sep. 30, 2021

Related U.S. Application Data

(63) Continuation-in-part of application No. 17/216,729, filed on Mar. 30, 2021.

(Continued)

(51) Int. Cl.
B23K 26/352 (2014.01)
B23K 26/362 (2014.01)
(Continued)

(52) U.S. Cl.
CPC .......... B23K 26/352 (2015.10); B23K 26/362 (2013.01); B23K 26/40 (2013.01);
(Continued)

(58) Field of Classification Search
CPC .......................... H01L 21/324; H01L 21/428; H01L 21/02675
See application file for complete search history.

(56) References Cited

U.S. PATENT DOCUMENTS 3,138,743 A 6/1964 Kilby
5,515,241 A 5/1996 Werther
(Continued)

OTHER PUBLICATIONS

Castellanos-Gomez et al. "Laser-thinning of MoS2: On-Demand Generation of a Single-Layer Semiconductor." Nano Letters. vol. 12, No. 6, 3187-3192 (2012). DOI: 10.1021/nl301164v. (Year: 2012).*

(Continued)

*Primary Examiner* — Yara B Green
*Assistant Examiner* — Erika H Son
(74) *Attorney, Agent, or Firm* — AFMCLO/JAZ; Jeffrey V. Bamber

(57) ABSTRACT

The present invention relates to processes of making components for electronic and optical devices using laser processing and devices comprising such components. Such process uses a laser to introduce chemical and/or structural changes in substrates and films that are the raw materials from which components for electronic and optical devices are made. Such process yields components that can have one or more electronic and/or optical functionalities that are integrated on the same substrate or film. In addition, such process does not require large-scale clean rooms and is easily configurable. Thus, rapid device prototyping, design change and evolution in the lab and on the production side is realized.

14 Claims, 12 Drawing Sheets metal contacts ⟶ a-MoS₂ precursor ⟶ 2H-MoS₂ synthesis

Au    Laser annealed MoS₂    Au

Related U.S. Application Data

(60) Provisional application No. 63/001,604, filed on Mar. 30, 2020.

(51) Int. Cl.

| | |
|---|---|
| *B23K 26/40* | (2014.01) |
| *B23K 101/38* | (2006.01) |
| *B23K 101/40* | (2006.01) |
| *H01L 21/02* | (2006.01) |
| *H01L 21/324* | (2006.01) |
| *H01L 21/428* | (2006.01) |
| *H10K 71/40* | (2023.01) |
| *H10P 14/20* | (2026.01) |
| *H10P 34/42* | (2026.01) |
| *H10P 95/90* | (2026.01) |

(52) U.S. Cl.
CPC ...... *H10P 14/3808* (2026.01); *B23K 2101/38* (2018.08); *B23K 2101/40* (2018.08); *H10K 71/421* (2023.02); *H10P 34/42* (2026.01); *H10P 95/90* (2026.01)

(56) References Cited

U.S. PATENT DOCUMENTS

| | | | | |
|---|---|---|---|---|
| 5,526,280 | A | 6/1996 | Consadori et al. | |
| 10,429,381 | B2 | 10/2019 | Hoffman | |
| 10,770,483 | B2 * | 9/2020 | Sugawara | H10D 30/6756 |
| 10,875,339 | B1 | 12/2020 | Claussen | |
| 11,469,351 | B2 * | 10/2022 | Li | H10F 77/12 |
| 12,123,845 | B2 * | 10/2024 | Mahjouri-Samani | |
| | | | | G01N 27/4145 |
| 2006/0246632 | A1 | 11/2006 | Okumura | |
| 2012/0043546 | A1 | 2/2012 | Oh | |
| 2018/0308692 | A1 * | 10/2018 | Muratore | H10D 62/80 |
| 2020/0090933 | A1 | 3/2020 | Muratore | |
| 2021/0299781 | A1 | 9/2021 | Glavin et al. | |
| 2021/0301381 | A1 | 9/2021 | Glavin et al. | |
| 2021/0313188 | A1 | 10/2021 | Glavin et al. | |
| 2021/0325380 | A1 | 10/2021 | Muthukumar | |
| 2022/0140147 | A1 * | 5/2022 | Choe | H10D 1/68 |
| | | | | 257/295 |
| 2022/0270891 | A1 * | 8/2022 | Currie | H01L 21/477 |
| 2023/0045818 | A1 | 2/2023 | Glavin et al. | |
| 2023/0148461 | A9 | 5/2023 | Glavin et al. | |
| 2023/0152309 | A9 | 5/2023 | Glavin et al. | |

OTHER PUBLICATIONS

Austin Drake et al: "Laser writing of electronic circuitry in thin film molybdenum disulfide: A transformative manufacturing approach", Materials Today 2020, 43, pp. 17-26.

Yi Rang Lim et al: "Roll-to-Roll Production of Layer-Controlled Molybdenum Disulfide: A Platform for 2D Semiconductor-Based Industrial Applications", Advanced Materials, 2018, 30,1705270, pp. 1-8.

Rai Rachel H et al: "Pulsed laser annealing of amorphous two-dimensional transition metal dichalcogenides" J. Vac. Sci. Technol. 2020, A 38, 052201, pp. 1-7.

PCT International Search Report for PCT/US22/20853.

PCT Written Opinion of The International Searching Authority for PCT/US22/20853.

Mcconny, M.E. et al.; "Direct synthesis of ultra-thin large area transition metal dichalcogenides and their heterostructures on stretchable polymer surfaces," J. of Mat. Res., 2016, 0, 0, 1-8.

Sirota, B. et al. "Room temperature magnetron sputtering and laser annealing of ultrathin MoS2 for flexible transistors," Vacuum, 2019, 160, 133-138.

Kim, R. H. et al.; "Photonic Crystallization of MoS2 for Stretchable Photodetectors," Nanoscale, 2019, 11, 13260-13268.

Galvin, N. R.; IEEE Presentation Rapid Conference in Miramar Beach, FL. Aug. 20, 2019, 1-44.

Ahmadi, Z. et al "Self-limiting laser crystallization and direct writing of 2D materials" Int. J. Extrem. Manuf. 2019, 1, 015001, 1-8.

Vilá, R. A. . et al "In situ crystallization kinetics of two-dimensional MoS2" 2D Mater. May 2018, 5, 011009, 1-8.

Muratore, C. "Biofunctionalized Two-dimensional MoS2 Receptors for Rapid Response Modular Electronic SARS-CoV-2 and Influenza A Antigen Sensors" medrxivorg., Nov. 20, 2020, 1-11.

Muratore, C. "Beyond point of care diagnostics: Lowdimensional nanomaterials for electronic virus sensing" J. Vac. Sci. Technol. A 2020, 38, 050804, 1-16.

U.S. Appl. No. 17/216,729, Nov. 25, 2024 Non-final Rejection.

Mine, H.; Kobayashi, A.; Nakamura, T.; Inoue, T.; Pakdel, S.; Marian, D.; Gonzalez-Marin, E.; Maruyama, S.; Katsumoto, S.; Fortunelli, A.; Palacios, J.J.; Haruyama, J.; Laser-Beam-Patterned Topological Insulating States on Thin Semiconducting MoS2 2019, Physical Review Letters 123, 146803.

Tan, Y.; Luo, F.; Zhu, M.; Xu, X.; Ye, Y.; Li, B.; Wang, G.; Luo, W.; Zheng, X.; Wu, N.; Yu, Y.; Qin, S.; Zhang, X.; Controllable 2H-to-1T' phase transition in few-layer MoTe2 Nanoscale 2018, 10, 19964-19971.

PCT International Search Report for PCT/US22/20850.

PCT Written Opinion of The International Searching Authority for PCT/US22/20850.

PCT International Search Report for PCT/US22/20851.

PCT Written Opinion of The International Searching Authority for PCT/US22/20851.

PCT International Search Report for PCT/US22/20854.

PCT Written Opinion of The International Searching Authority for PCT/US22/20854.

Castellanos-Gomez et al. ("Laser-thinning of MoS2: On-Demand Generation of a Single-Layer Semiconductor." Nano Letters. vol. 12, No. 6, 3187-3192 (2012). DOI: 10.1021/nl301164v).

Kukkar et al. ("A New Electrolytic Synthesis Method for Few Layered MoS2 Nanosheets and Their Robust Biointerfacing With Reduced Antibodies." ACS Applied Materials & Interfaces, 8, 16555-16563 (2016). DOI: 10.1021/acsami.6b03079).

U.S. Appl. No. 17/336,855, Feb. 13, 2025 Non-final Rejection.

U.S. Appl. No. 17/336,799, Mar. 3, 2025 Non-final Rejection.

U.S. Appl. No. 17/216,729, Apr. 21, 2025 Final Rejection.

U.S. Appl. No. 17/336,799, Mar. 31, 2025 Non-final Rejection.

U.S. Appl. No. 17/523,705, Jun. 5, 2025 Non-final Rejection.

U.S. Appl. No. 17/523,721, Apr. 15, 2025 Non-final Rejection.

U.S. Appl. No. 17/957,293, Apr. 15, 2025 Non-final Rejection.

Supplemental information for Kukkar, et al. "A New Electrolytic Synthesis Method for Few Layered MoS2 Nanosheets and Their Reduced Antibodies", ACS Applied Materials & Interfaces, 8, 16555-16563 (2016). DOI: 10.1021/acsami.6b03079. (Year: 2016).

Zhang, et al. "Protocell arrays for simulatneous detection of diverse analytes", Nat Commun 12, 5724 (2001). DOE: 10.1038/s41467-021-25989-3. (Year: 2021).

Lee, et al. "Two-dimensional Layered MoS2 Biosensors Enable Highly Sensitive Detection of Biomolecules", Sci Rep 4, 7352 (2014). DOI: 10.1038/srep07352. (Year: 2014).

Windom, et al. "A Raman Spectroscopic Study of MoS2 and MoO3: Applications to Tribological Systems", Tribol Lett 42, 301-310 (2011). DOI: 10.1007/s11249-011-9774-x) (Year: 2011).

Lu, et al., "Layer-by-layer thinning of MoS2 by thermal annealing", Nanoscale 5, 8904-8908 (2013). DOI: 10.1039/c3nr03101b (Year: 2013).

Li, et al., "The Stability of Metallic MoS2 Nanosheets and Their Property Change by Annealing", Nanomaterials, 9, 1366 (2019). DOI: 10.3390/nano9101366. (Year: 2019).

Kang, et al., "High-performance MoS2 transistors with low-resistance molybdenum contacts", Applied Physics Letters 104, 093106 (2014). DOI: 10.1063/1.4866340. (Year: 2014).

USPA U.S. Appl. No. 17/336,855, filed Sep. 12, 2025 Non-final Rejection.

USPA U.S. Appl. No. 17/523,705, filed Oct. 31, 2025 Final Rejection.

(56) References Cited

OTHER PUBLICATIONS

USPA U.S. Appl. No. 17/957,293, filed Nov. 28, 2025 Final Rejection.

Naylor et al. ("Scalable Production of Molybdenum Disulfide Based Biosensors." ACS Nano, 10(6), 6173-6179 (2016). DOI: 10.1021 /acsnano.6b02137). (Year: 2016).

Rajeev et al. ("Laser patterned polymer/nanotube composite electrodes for nanowire transistors on flexible substrates." arXiv: Applied Physics (2017). DOI: 10.48550/arXiv.1711.06925). (Year: 2017).

Kang et al. ("Controllable atomic-ratio of CVD-grown MoS2-MoO2 hybrid catalyst by soft annealing for enhancing hydrogen evolution reaction." International Journal of Hydrogen Energy, 45, 1399-1408 (2020). DOI: 10.1016/j. ijhydene.2019.11.066). (Year: 2019).

Li et al. ("Fibroin-like Peptides Self-Assembling on Two-Dimensional Materials as a Molecular Scaffold for Potential Biosensing." ACS Applied Materials & Interfaces, 11, 20670-20677 (2019). DOI: 10.1021/acsami.9b04079). (Year: 2019).

Wells et al. ("Roll-to-Roll Deposition of Semiconducting 20 Nanoflake Films of Transition Metal Dichalcogenides for Optoelectronic Applications." ACS Appl. Nano Mater., 2, 7705-7712 (2019). DOI: 10.1021/acsanm.9b01774). (Year: 2019).

Park et al. ("Laser-directed synthesis of strain-induced crumpled MoS2 structure for enhanced triboelectrification toward haptic sensors." Nano Energy, 78, 105266 (2020). DOI: 10.1016/j.nanoen. 2020.105266). (Year: 2020).

* cited by examiner

PROCESS OF MAKING COMPONENTS FOR ELECTRONIC AND OPTICAL DEVICES USING LASER PROCESSING ON A PATTERNED CONDUCTIVE FILM

CROSS-REFERENCE TO RELATED APPLICATION

The present application is a continuation-in-part of U.S. patent application Ser. No. 17/216,729 filed Mar. 30, 2021, which in turn claims priority to U.S. Provisional Application Ser. No. 63/001,604 filed Mar. 30, 2020, the contents of U.S. patent application Ser. No. 17/216,729 and U.S. Provisional Application Ser. No. 63/001,604 hereby incorporated by reference in its entry.

RIGHTS OF THE GOVERNMENT

The invention described herein may be manufactured and used by or for the Government of the United States for all governmental purposes without the payment of any royalty.

FIELD OF THE INVENTION

The present invention relates to processes of making components for electronic and optical devices using laser processing and devices comprising such components.

BACKGROUND OF THE INVENTION

Device elements (e.g. resistors, capacitors, diodes, sensors, MOSFETs and bipolar junction transistors) within circuits rely on controlling the electron transport within three basic building blocks of electronic materials: insulators, conductors, and semiconductors. It is only through the precise and tedious integration of these three subsets of materials that we realize electronics, as we know them today. Current methods of making components for electronic and optical devices require large-scale clean rooms and are not easily reconfigurable. As a result, rapid device prototyping, design change and evolution is not only difficult in the lab but also prohibitive on the production side. As a result, industry has looked to additive manufacturing processes for a solution. Unfortunately, reproducibility, ink stability, and material limitations remain as barriers to an additive manufacturing solution. In addition to the aforementioned problems, current methods of making components for electronic and optical devices are limited to producing primarily single function components that are later assembled with other components to yield the desired electronic and/or optical functionality. Thus, what is needed is an efficient, easily reconfigurable process of making components for electronic and optical devices that not only can yield single function components but also can yield components with multiple functions that are integrated on the same substrate or film.

Applicants recognized that lasers could not only be used to remove material from substrates and films but could also be used to induce chemical and/or structural changes in substrates and films with distinct electronic properties. Such recognition led Applicants to develop a process of making components for electronic and optical devices, devices that can have one or more electronic and/or optical functionalities. Such process employs localization of such material transformations, thereby allowing added flexibility in performing steps for device processing, such as application and patterning of electrical contacts prior to application of active electronic material. Importantly, Applicants process can be used to make structural and/or chemical changes within a film or other article that results in an electrical component, an optical component or a combined electrical and optical component being created in such film or article. Such process does not require large-scale clean rooms and is easily configurable. Thus, rapid device prototyping, design change and evolution in the lab and on the production side are realized.

SUMMARY OF THE INVENTION

The present invention relates to processes of making components for electronic and optical devices using laser processing and devices comprising such components. Such process uses a laser to introduce chemical and/or structural changes and/or removal of material through ablation or similar laser removal processes in substrates and films that are the raw materials from which components for electronic and optical devices are made. Such process yields components that can have one or more electronic and/or optical functionalities that are integrated on the same substrate or film. In addition, such process does not require large-scale clean rooms and is easily configurable. Thus, rapid device prototyping, design change and evolution in the lab and on the production side is realized.

Additional objects, advantages, and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

DETAILED DESCRIPTION OF THE INVENTION

Definitions

Figure 1:
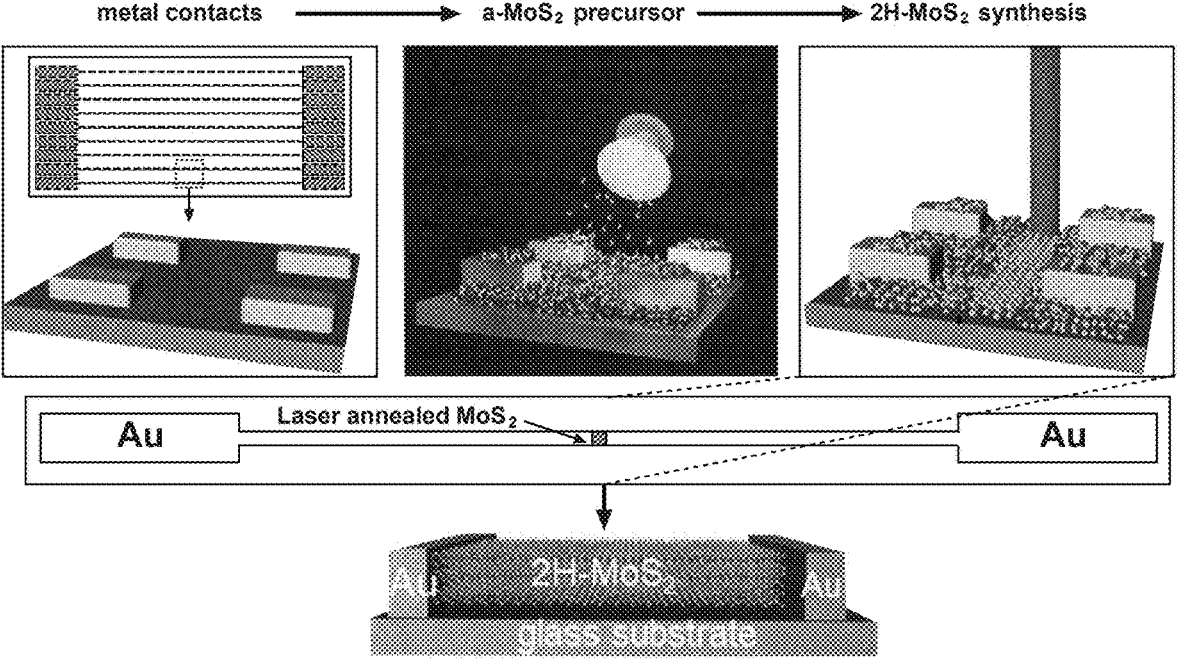
FIG. 1 is a schematic depicting the process of coating $MoS_2$ onto patterned metal contacts followed by laser conversion to 2H-phase $MoS_2$ device.

Unless specifically stated otherwise, as used herein, the terms "a", "an" and "the" mean "at least one".

As used herein, the terms "include", "includes" and "including" are meant to be non-limiting.

As used herein, the words "about," "approximately," or the like, when accompanying a numerical value, are to be construed as indicating a deviation as would be appreciated by one of ordinary skill in the art to operate satisfactorily for an intended purpose.

As used herein, the words "and/or" means, when referring to embodiments (for example an embodiment having elements A and/or B) that the embodiment may have element A alone, element B alone, or elements A and B taken together.

Unless otherwise noted, all component or composition levels are in reference to the active portion of that component or composition, and are exclusive of impurities, for example, residual solvents or by-products, which may be present in commercially available sources of such components or compositions.

All percentages and ratios are calculated by weight unless otherwise indicated. All percentages and ratios are calculated based on the total composition unless otherwise indicated.

It should be understood that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

Processes of Making Components for Electronic and Optical Devices

For purposes of this specification, headings are not considered paragraphs and thus this paragraph is paragraph twenty-eight of the present specification. The individual number of each paragraph above and below this paragraph can be determined by reference to this paragraph's number. In this paragraph twenty-eight, Applicants disclose a process of making an electrical component, an optical component or a combined electrical and optical component, said process comprising pattern illumination-based annealing a coated substrate comprising a substrate having a first side and a second side, a.) said substrate's first side comprising;

(i) one or more coatings of patterned electrical conductive material disposed over said substrate's first side, preferably said patterned electrical conductive material comprises a material selected from the group consisting of poly(3,4-ethylenedioxythiophene), poly(3,4-ethylenedioxythiophene) polystyrene sulfonate, poly(pyrrole), polycarbazoles, polyindoles, polyazepines, Cr, Mo, Ti, Sc, Ni, V, Hf, W, Nb, Au, Ag, Cu, and Pt and mixtures thereof; more preferably said patterned electrical conductive material comprises a metal selected from the group consisting of Cr, Mo, Ti, Sc, Ni, V, Hf, W, Nb, Au, Ag, Cu, and Pt and mixtures thereof, most preferably said metal comprises a metal selected from the group consisting of Mo, Cr, Ti, Au and mixtures thereof, most preferably said one or more coatings of patterned electrical conductive material is a coating of Mo, a coating of Cr and a second coating of Au over said coating of Cr or a coating of Ti and a second coating of Au over said coating of Ti;

(ii) one or more chemical coatings disposed over said one or more coatings of patterned electrical conductive material, said one or more chemical coatings each independently comprising a transition metal and an element selected from the group consisting of hydrogen, carbon, nitrogen, oxygen, sulfur, selenium, phosphorous and mixtures thereof, preferably said one or more chemical coatings each independently comprises a transition metal and an element selected from the group consisting of oxygen, sulfur, selenium and mixtures thereof, said one or more chemical coatings each independently comprising at least one of an amorphous, nanocrystalline, microcrystalline or crystalline region, preferably said chemical coatings comprises one or more transition metal dichalcogenides, preferably said one or more transition metal dichalcogenides are selected from the group consisting of MoS$_2$, WS$_2$, MoSe$_2$, WSe$_2$, and mixtures thereof;

b.) said substrate's second side optionally comprising:

(i) one or more coatings of patterned electrical conductive material disposed over said substrate's first side, preferably said patterned electrical conductive material comprises a material selected from the group consisting of poly(3,4-ethylenedioxythiophene), poly(3,4-ethylenedioxythiophene) polystyrene sulfonate, poly(pyrrole), polycarbazoles, polyindoles, polyazepines, Cr, Mo, Ti, Sc, Ni, V, Hf, W, Nb, Au, Ag, Cu, and Pt and mixtures thereof; more preferably said patterned electrical conductive material comprises a metal selected from the group consisting of Cr, Mo, Ti, Sc, Ni, V, Hf, W, Nb, Au, Ag, Cu, and Pt and mixtures thereof, most preferably said metal comprises a metal selected from the group consisting of Mo, Cr, Ti, Au and mixtures thereof, most preferably said one or more coatings of patterned electrical conductive material is a coating of Mo, a coating of Cr and a second coating of Au over said coating of Cr or a coating of Ti and a second coating of Au over said coating of Ti; and (ii) one or more chemical coatings disposed over said one or more coatings of patterned electrical conductive material, said one or more chemical coatings each independently comprising a transition metal and an element selected from the group consisting of hydrogen, carbon, nitrogen, oxygen, sulfur, selenium, phosphorous and mixtures thereof, preferably said one or more chemical coatings each independently comprises a transition metal and an element selected from the group consisting of oxygen, sulfur, selenium and mixtures thereof, said one or more chemical coatings each independently comprising at least one of an amorphous, nanocrystalline, microcrystalline or crystalline region, preferably said chemical coatings comprises one or more transition metal dichalcogenides, preferably said one or more transition metal dichalcogenides are selected from the group consisting of $MoS_2$, $WS_2$, $MoSe_2$, $WSe_2$ and mixtures thereof;

said pattern illumination-based annealing comprising using one or more lasers and/or lamps to achieve at least one of a chemical change or structural change in at least a portion of at least one of said one or more chemical coatings on at least one side of said substrate, and optionally the removal of at least a portion of said chemical coating on at least one side of said substrate. Each of said chemical coatings may be disposed over said one or more coatings of patterned electrical conductive material via chemical and/or physical vapor deposition processes, including but not limited to thermal decomposition of one or more precursor gases, thermal evaporation, electron beam evaporation, pulsed laser deposition, magnetron sputtering, pulsed direct current magnetron sputtering, high power impulse magnetron sputtering, and/or molecular beam epitaxy.

Applicants disclose the process of paragraph twenty-eight wherein:

a.) at least one of said one or more chemical coatings comprises two or more regions that are amorphous, nanocrystalline, microcrystalline or crystalline with the proviso that at least two of said regions are not identical with respect to being amorphous, nanocrystalline, microcrystalline or crystalline and said laser or lamp forms on, within or on and within said at least one of said one or more chemical coatings:

(i) at least two electronic elements selected from a conductor, semiconductor and an insulator;

(ii) two or more different conductors having at least one of the following: different electrical properties or different optical properties;

(iii) two or more different semiconductors having at least one of the following: different electrical properties or different optical properties; or (iv) two or more different insulators having at least one of the following: different electrical properties or different optical properties;

said process being performed under one of the following conditions: vacuum of less 100 torr, air or under a fluid blanket other than air;

said pattern illumination-based annealing resulting in at least one of a chemical change or structural change, and the removal of at least a portion of at least one of said one or more chemical coatings and resulting in an electrical component, an optical component or a combined electrical and optical component being formed on, within or on and within at least a portion of said pattern illumination-based annealed one or more chemical coatings; or b) at least one of said one or more chemical coatings comprises at least one region that is amorphous, nanocrystalline, microcrystalline or crystalline, and said one or more lasers and/or lamps forms on, within or on and within said at least one of said one or more chemical coatings:

(i) at least two electronic elements selected from a conductor, semiconductor and an insulator;

(ii) two or more different conductors having at least one of the following: different electrical properties or different optical properties;

(iii) two or more different semiconductors having at least one of the following: different electrical properties or different optical properties; or (iv) two or more different insulators having at least one of the following: different electrical properties or different optical properties;

said process being performed under one of the following environmental conditions: vacuum of less 100 torr, air or under a fluid blanket other than air, then repeating, one or more times said pattern illumination-based annealing on said portion of said one or more chemical coatings using one or more of the following:

(i) the same device but at least one of the following: a different intensity or time;

(ii) a different environmental condition from the previous environmental condition, said different environmental condition select from the same group of environmental conditions; or (iii) a lamp if the previous pattern illumination-based annealing was laser pattern illumination-based annealing or a laser if the previous pattern illumination-based annealing was lamp pattern illumination-based annealing said pattern illumination-based annealing resulting in at least one of a chemical change or structural change, and the removal of at least a portion of at least one of said one or more chemical coatings and resulting in an electrical component, an optical component or a combined electrical and optical component being formed on, within or on and within at least a portion of said pattern illumination-based annealed one or more chemical coatings.

Applicants disclose the process of paragraphs twenty-eight through twenty-nine wherein, for element 2b) of paragraph twenty-nine said at least one chemical coating comprises two or more regions that are amorphous, nanocrystalline, microcrystalline or crystalline with the proviso that at least two of said regions are not identical with respect being amorphous, nanocrystalline, microcrystalline or crystalline, at least two of said regions being pattern illumination-based annealed via different pattern illumination-based annealing processes.

Applicants disclose the process according to paragraphs twenty-eight through thirty, wherein said transition metal is selected from the group consisting of molybdenum, tungsten, niobium, tantalum, vanadium, titanium, chromium, iron, rhodium, hafnium, rhenium and mixtures thereof.

Applicants disclose the process according to paragraphs twenty-eight through thirty-one, wherein said process is performed under a fluid blanket other than air.

Applicants disclose the process according to paragraphs twenty-eight through thirty-one, wherein said fluid blanket comprises:

a) an element selected from the group consisting of krypton, xenon, radon, argon, neon, helium, hydrogen, carbon, nitrogen, oxygen, sulfur, selenium, phosphorous and mixtures thereof;

b) based on total fluid volume greater than 0% to about 19% or from 21% to 100% oxygen; and/or c) greater than 0% to about 78% or from 80% to 100% nitrogen.

Applicants disclose the process according to paragraphs twenty-eight through thirty-three, wherein said material comprises at least one region that is amorphous or nanocrystalline.

Applicants disclose the process according to paragraphs twenty-eight through thirty-four, wherein said pattern illumination-based annealing is achieved by using one or more lasers, said one or more lasers each being independently selected from a laser that is a pulsed laser, a continuous laser or a pulsed/continuous laser. A pulsed/continuous laser is a laser that can provide a pulsed laser beam and a continuous laser.

Applicants disclose the process according to paragraphs twenty-eight through thirty-four, wherein said pattern illumination-based annealing is achieved by using a continuous wave laser to subject at least a portion of said chemical coating, for a time of about 0.001 milliseconds to 60 seconds to said continuous laser, preferably for a time of about 0.1 milliseconds to 10 seconds to said continuous laser, more preferably for a time of about 1 millisecond to 1 second to said continuous laser; said continuous laser having power of from about 1 microwatt to about 1 megawatt over the time period said at least a portion of said chemical coating is subjected to said continuous laser, preferably said continuous laser having power of from about 0.1 milliwatt to about 1 kilowatt over the time period said at least a portion of said chemical coating is subjected to said continuous laser, more preferably said continuous laser having power of from about 1 microwatt to about 500 watts over the time period said at least a portion of said chemical coating is subjected to said continuous laser; preferably said portion of said chemical coating has an area of about 100 square nanometers to about 1 square meter, more preferably said portion of said chemical coating has an area of about 1 square micrometer to about 1 $cm^2$, most preferably said portion of said chemical coating has an area of about 100 square micrometers to about 250,000 square micrometers. Said portion of said chemical coating may be of any geometry including but not limited to a rectangular, circular or square geometry.

Applicants disclose the process according to paragraphs twenty-eight through thirty-four, wherein said pattern illumination-based annealing is achieved by using a lamp to subject at least a portion of said chemical coating for a time of about 10 microseconds to about 500,000 microseconds, preferably for a time of about 25 microseconds to about 100,000 microseconds, more preferably for a time of about 50 microseconds to about 1,000 microseconds to said lamp, said lamp having power of from about 0.01 $J/cm^2$ to about 1,000 $J/cm^2$, preferably said lamp having power of from about 0.1 $J/cm^2$ to about 100 $J/cm^2$, more preferably said lamp having power of from about 2 $J/cm^2$ to about 10 $J/cm^2$, preferably said portion of said chemical coating has an area of about 1 square micrometer to about 50 square meters, more preferably said portion has an area of about 1 square micrometers to about 1 square meter, most preferably said portion of said chemical coating has an area of about 10 square micrometers to about 1 $cm^2$. Said portion of said chemical coating may be of any geometry including but not limited to a rectangular, circular or square geometry.

Applicants disclose the process according to paragraphs twenty-eight through thirty-four, wherein said pattern illumination-based annealing is achieved by using a pulsed laser to subject at least a portion of said chemical coating for a time of about 0.1 femtoseconds to 60 seconds to said pulsed laser, preferably for a time of about 0.1 nanoseconds to 1 second to said pulsed laser, more preferably for a time of about 10 nanoseconds to 1 millisecond to said pulsed laser; said pulsed laser having a peak power of from about 0.1 microwatt to about 1000 gigawatts over the time period said at least a portion of said chemical coating is subjected to said pulsed laser, preferably said pulsed laser having a peak power of from about 0.1 milliwatt to about 100 megawatts over the time period said at least a portion of said chemical coating is subjected to said pulsed laser, more preferably said pulsed laser having a peak power of from about 1 watt to about 50 megawatts over the time period said at least a portion of said chemical coating is subjected to said pulsed laser; said pulsed laser having a pulse period of about 0.1 femtoseconds to 1 second, preferably said pulsed laser having a pulse period of about 0.1 nanosecond to 1 microsecond, more preferably said pulsed laser having a pulse period of about 1 nanosecond to 100 nanoseconds; preferably said portion of said chemical coating has an area of about 100 square nanometers to about 1 square meter, more preferably said portion of said chemical coating has an area of about 1 square micrometers to about 1 $cm^2$, most preferably said portion of said chemical coating has an area of about 100 square micrometers to about 500 square micrometers. Said portion of said chemical coating may be of any geometry including but not limited to a rectangular, circular or square.

Applicants disclose the process according to paragraphs twenty-eight through thirty-eight, wherein said each chemical coating independently has a thickness of from about 0.1 nanometers to about 1 centimeter.

Applicants disclose the process according to paragraphs twenty-eight through thirty-eight, wherein said each chemical coating independently has a thickness of from about 0.3 nanometers to about 10 micrometers.

Applicants disclose the process according to paragraphs twenty-eight through forty, wherein said electrical and/or optical component is selected from the group consisting of an inductor, a capacitor, a resistor, a diode, a transistor, a trace, a battery, an optical filter, a chemical sensor, a biological sensor and a solar cell.

Applicants disclose the process according to paragraphs twenty-eight through forty-one, wherein each of said one or more chemical coatings have an area and a thickness and said removal of said at least a portion of said one or more chemical coating occurs, said removal comprising at least one of:

a.) laser ablation removal of from about 0.1% to about 99.9% of at least one of said one or more chemical coatings' area, preferably said removal comprising laser ablation removal of from about 2% to about 98% of at least one of said chemical coatings' area, more preferably said removal comprising laser ablation removal of from about 10% to about 90% of at least one of said chemical coatings' area; or b.) laser ablation removal of at least 85% of at least one of said chemical coatings' thickness, preferably said removal comprises laser ablation removal of at least 95% of at least one of said chemical coatings' thickness; or laser ablation removal of about 85% to about 99% of at least one of said chemical coatings' thickness.

Applicants disclose the process according to paragraphs twenty-eight through forty-two, said process being a roll process wherein said coated chemically substrate is a rolled coated chemically substrate that is unrolled at least in part, said unrolled chemical coating portion of said coated substrate being at least in part pattern illumination-based annealed, preferably said roll process is a continuous process, more preferably said roll process is a roll to roll process wherein said coated substrate is unrolled at least in part, said unrolled portion being, at least in part, pattern illumination-based annealed and rerolled.

Applicants disclose the process according to paragraphs twenty-eight through forty-three, wherein said substrate of said coated substrate is selected from glass, polymer and mixtures thereof, preferably said polymer is selected from the group consisting of polyethylene naphthalate, polyimide, polycarbonate, polyethylene naphthalate and polyethylene terephthalate and mixtures thereof.

Applicants disclose a process according to paragraphs twenty-eight through forty-four, wherein at least a portion of said coated substrate's pattern illumination-based annealed chemical coating is further treated by at least one of the following processes:

a.) two or more pattern illumination-based annealings; said two more pattern illumination-based annealings may each be independently conducted in accordance with the process disclosed in Paragraphs 0028 through 0044;

b.) plasma treatment comprising exposing said at least a portion of said coated substrate's pattern illumination-based annealed chemical coating to an ionized gas derived from the group consisting of He, Ne, Ar, Kr, Xe, $H_2$, $O_2$, $SF_6$, $CF_4$, $N_2$ and mixtures thereof; preferably said plasma treatment comprises exposing said at least a portion of said coated substrate's pattern illumination-based annealed chemical coating to an ionized gas derived from the group consisting of He, Ar, $H_2$, $O_2$, $SF_6$, $CF_4$ and mixtures thereof, more preferably said plasma treatment comprises exposing said at least a portion of said coated substrate's pattern illumination-based annealed chemical coating to an ionized gas derived from the group consisting of Ar, $H_2$, $SF_6$, $CF_4$ and mixtures thereof, most preferably said plasma treatment comprises exposing said at least a portion of said coated substrate's pattern illumination-based annealed chemical coating to an ionized gas derived from the group consisting of Ar, $H_2$ and mixtures thereof;

(i) said plasma treatment being conducted at a pressure of from about 0.1 mTorr to about 1000 Torr, preferably said plasma treatment being conducted at a pressure of about 0.5 mTorr to about 760 Torr, more preferably said plasma treatment being conducted at a pressure of about 1 mTorr to about 100 Torr, most preferably said plasma treatment being conducted at a pressure of about 1 mTorr to about 10 Torr;

(ii) said at least a portion of said coated substrate's pattern illumination-based annealed chemical coating's plasma treatment temperature being from about 0° C. to about 1,500° C., preferably said at least a portion of said coated substrate's pattern illumination-based annealed chemical coating's plasma treatment temperature being from about 5° C. to about 1,000° C., more preferably said at least a portion of said coated substrate's pattern illumination-based annealed chemical coating's plasma treatment temperature being from about 5° C. to about 900° C., most preferably said at least a portion of said coated substrate's pattern illumination-based annealed chemical coating's plasma treatment temperature being from about 18° C. to about 700° C.; and (iii) said at least a portion of said coated substrate's pattern illumination-based annealed chemical coating exposure time being from about 0.001 seconds to about 10,000,000 seconds, preferably said at least a portion of said coated substrate's pattern illumination-based annealed chemical coating exposure time being from about 0.01 seconds to about 1,000,000 seconds, more preferably said at least a portion of said coated substrate's pattern illumination-based annealed chemical coating exposure time being from about 0.1 seconds to about 100,000 seconds, most preferably said at least a portion of said coated substrate's pattern illumination-based annealed chemical coating exposure time being from about 0.1 seconds to about 10,000 seconds. Different modes of plasma generation may include remote plasmas from sources such as electron cyclotron resonance, inductively coupled plasmas, capacitively coupled plasmas, and electron beam generated plasmas. Inductively coupled and glow discharge plasmas by coupling of power to the substrate may also be used alone or in conjunction with a remote plasma source. Plasma power may be continuous or pulsed from frequencies ranging from 0.01 Hz to 10 GHz;

c.) ion beam irradiation comprising exposing said at least a portion of said coated substrate's pattern illumination-based annealed chemical coating to an ion beam, said ion beam comprising an ionized gas derived from the group consisting of He, Ne, Ar, Kr, Xe, $H_2$, $O_2$, $SF_6$, $CF_4$, $N_2$ and mixtures thereof; preferably said ion beam comprises an ionized gas derived from the group consisting of He, Ar, $H_2$, $O_2$, $SF_6$, $CF_4$ and mixtures thereof, more preferably said ion beam comprising an ionized gas derived from the group consisting of Ar, $H_2$, $SF_6$, $CF_4$ and mixtures thereof, most preferably said ion beam comprising an ionized gas derived from the group consisting of Ar, $H_2$ and mixtures thereof;

(i) said ion beam having an incident ion energy of from about 50 eV to about 10,000 eV, preferably said ion beam having an incident ion energy of from about 100 eV to about 5,000 eV, more preferably said ion beam having an incident ion energy of from about 100 eV to 2000 eV, most preferably said ion beam having an incident ion energy of from about 100 eV to 1000 eV;

(ii) said ion beam having an incoming ion species incident angle of from about 1° to 90°, relative to the surface being bombarded, preferably said ion beam having an incoming ion species incident angle of from about 3° to about 90°, more preferably said ion beam having an incoming ion species incident angle of from about 4° to about 90°, and most preferably said ion beam having an incoming ion species inci-dent angle of from about 5° to about 90°;

(iii) said ion beam having an incident ion flux of from about 0.1 $nA/mm^2$ to about 900,000,000 $nA/mm^2$, preferably said ion beam having an incident ion flux of from about 0.5 $nA/mm^2$ to about 10,000,000 $nA/mm^2$, more preferably said ion beam having an incident ion flux of from about 0.5 to about 1,000,000 $nA/mm^2$, and most preferably said ion beam having an incident ion flux of from about 0.5 to about 900,000 $nA/mm^2$;

(iv) said at least a portion of said coated substrate's pattern illumination-based annealed chemical coating's ion beam irradiation treatment temperature being from about 0° C. to about 1,500° C., preferably said at least a portion of said coated substrate's pattern illumination-based annealed chemical coating's ion beam irradiation treatment temperature being from about 5° C. to about 1,000° C., more preferably said at least a portion of said coated substrate's pattern illumination-based annealed chemical coating's ion beam irradiation treatment temperature being from about 5° C. to about 900° C., most preferably said at least a portion of said coated substrate's pattern illumination-based annealed chemical coating's ion beam irradiation treatment temperature being from about 18° C. to about 700° C.; and (v) said at least a portion of said coated substrate's pattern illumination-based annealed chemical coating's ion beam irradiation exposure time to said ion beam being from about 0.001 seconds to about 10,000,000 seconds, preferably said at least a portion of said coated substrate's pattern illumination-based annealed chemical coating's ion beam irradiation exposure time to said ion beam being from about 0.01 seconds to about 1,000,000 seconds, more preferably said at least a portion of said coated substrate's pattern illumination-based annealed chemical coating's ion beam irradiation exposure time to said ion beam being from about 0.1 seconds to about 100,000 seconds, most preferably at least a portion of said coated substrate's pattern illumination-based annealed chemical coating's ion beam irradiation exposure time to said ion beam being from about 0.1 seconds to about 10,000 seconds; Sensor surface is a means to generate sulfur vacancies.

d.) electron beam illumination comprising at least a portion of said coated substrate's pattern illumination-based annealed chemical coating to an electron dose of from about $10^2$ electrons/$nm^2$ to about $10^{25}$ electrons/$nm^2$, preferably from about $10^3$ electrons/$nm^2$ to about $10^{22}$ electrons/$nm^2$, more preferably from about $10^4$ electrons/$nm^2$ to about $10^{20}$ electrons/$nm^2$, most preferably from about $10^5$ electrons/$nm^2$ to about $10^{18}$ electrons/$nm^2$ by exposing said at least a portion of said coated substrate's pattern illumination-based annealed chemical coating to:

(i) to an electron beam having an incident electron energy of from about 0.1 eV to about 100,000,000 eV, preferably said electron beam having an incident electron energy of from about 1 eV to about 10,000,000 eV, more preferably said electron beam having an incident electron energy of from about 1 eV to about 1,000,000 eV, most preferably said electron beam having an incident electron energy of from about 1 eV to about 500,000 eV;

(ii) said at least a portion of said coated substrate's pattern illumination-based annealed chemical coating's electron beam illumination exposure time to said electron beam illumination being from about 0.001 seconds to about 10,000,000 seconds, preferably said at least a portion of said coated substrate's pattern illumination-based annealed chemical coating's electron beam illumination exposure time to said electron beam illumination being from about 0.01 seconds to about 1,000,000 seconds, more preferably said at least a portion of said coated substrate's pattern illumination-based annealed chemical coating's electron beam illumination exposure time to said electron beam illumination being from about 0.1 seconds to about 100,000 seconds, most preferably at least a portion of said coated substrate's pattern illumination-based annealed chemical coating's electron beam illumination exposure time to said electron beam illumination being from about 0.1 seconds to about 10,000 seconds;

(iii) said at least a portion of said coated substrate's pattern illumination-based annealed chemical coating's electron beam illumination treatment temperature being from about 0° C. to about 1,500° C., preferably said at least a portion of said coated substrate's pattern illumination-based annealed chemical coating's electron beam illumination treatment temperature being from about 5° C. to about 1,000° C., more preferably said at least a portion of said coated substrate's pattern illumination-based annealed chemical coating's electron beam illumination treatment temperature being from about 5° C. to about 900° C., most preferably said at least a portion of said coated substrate's pattern illumination-based annealed chemical coating's electron beam illumination treatment temperature being from about 18° C. to about 700° C. Electron beam illumination is a means of inducing surface changes on said at least a portion of said coated substrate's pattern illumination-based annealed chemical coating. Such changes improve and/or control sites for physical and/or chemical bonding.

e.) thermal annealing said at least a portion of said coated substrate's pattern illumination-based annealed chemical coating, said at least a portion of said coated substrate's pattern illumination-based annealed chemical coating's thermal annealing treatment temperature being from about 0° C. to about 1,500° C., preferably said at least a portion of said coated substrate's pattern illumination-based annealed chemical coating's thermal annealing treatment temperature being from about 5° C. to about 1,000° C., more preferably said at least a portion of said coated substrate's pattern illumination-based annealed chemical coating's thermal annealing treatment temperature being from about 5° C. to about 900° C., preferably said at least a portion of said coated substrate's pattern illumination-based annealed chemical coating's thermal annealing treatment temperature being from about 18° C. to about 700° C.;

f.) chemically etching said at least a portion of said coated substrate's pattern illumination-based annealed chemical coating comprising contacting said at least a portion of said coated substrate's pattern illumination-based annealed chemical coating with an etching composition, preferably said coated substrate's pattern illumination-based annealed chemical coating is treated in accordance with at least one of the process of 18*a*) or 18*b*) prior to said contact with said etching composition, preferably said etching composition is a solution, gel or paste, more preferably said etching composition is a solution having an etching concentration of from about 0.00003 mol/L to about 30 mol/L, more preferably said etching composition is a solution having an etching concentration of from about 0.0003 mol/L to about 25 mol/L, more preferably said etching composition is a solution having an etching concentration of from about 0.003 mol/L to about 20 mol/L, most preferably said etching composition is a solution having an etching concentration of from about 0.03 mol/L to about 20 mol/L; said contacting occurring for a time of from about 0.001 seconds to about 10,000,000 seconds, preferably said contacting occurring for a time of from about 0.01 seconds to about 1,000,000 seconds, more preferably said contacting occurring for a time of from about 0.1 seconds to about 100,000 seconds, and most preferably said contacting occurring for a time of from about 0.1 seconds to about 10,000 seconds, said etching composition having a temperature over said contacting time of from about 0° C. to about 200° C., preferably said etching composition having a temperature over said contacting time of from about 5-180° C., more preferably said etching composition having a temperature over said contacting time of from about 10° C. to about 150° C., most preferably said etching composition having a temperature over said contacting time of from about 18° C. to about 100° C. While not being bound by theory, Applicants believe that sulfur and/or selenium vacancies in $MoS_2$ are produced via chemical modification by f.) etching $MoS_2$ in a solution such as sodium hypochlorite (NaClO) solution as provided above.

g.) electro-chemically treating said at least a portion of said coated substrate's pattern illumination-based annealed chemical coating by contacting said at least a portion of said coated substrate's pattern illumination-based annealed chemical coating with a chemical composition comprising an electrolyte and subjecting said contacted at least a portion of said coated substrate's pattern illumination-based annealed chemical coating and said chemical composition comprising an electrolyte to an electrical current, preferably at least a portion of said coated substrate's pattern illumination-based annealed chemical coating is subjected to said electrical current for a time of from about 0.01 seconds to about 60,000 seconds, more preferably at least a portion of said coated substrate's pattern illumination-based annealed chemical coating is subjected to said electrical current for a time of from about 0.1 seconds to about 6,000 seconds, more preferably at least a portion of said coated substrate's pattern illumination-based annealed chemical coating is subjected to said electrical current for a time of from about 1 seconds to about 600 seconds, most preferably at least a portion of said coated substrate's pattern illumination-based annealed chemical coating is subjected to said electrical current for a time of from about 10 seconds to about 60 seconds, preferably said at least a portion of said coated substrate's pattern illumination-based annealed chemical coating's temperature is from about 0° C. to about 200° C. during said time, preferably said at least a portion of said coated substrate's pattern illumination-based annealed chemical coating's temperature is from about 5° C. to about 180° C. during said time, more preferably said at least a portion of said coated substrate's pattern illumination-based annealed chemical coating's temperature is from about 10° C. to about 150° C. during said time, most preferably said at least a portion of said coated substrate's pattern illumination-based annealed chemical coating's temperature is from about 18° C. to about 100° C. during said time, preferably said electrolyte's concentration is from about 0.0005M to about 50 M, more preferably said electrolyte's concentration is from about 0.005M to about 25M, more preferably said electrolyte's concentration is from about 0.05M to about 20M, most preferably said electrolyte's concentration is from about 0.5M to about 10M, preferably said electrical current has a linear sweep voltammetry sweeping speed of from about 0.001 mV s$^{-1}$ to about 500 mV s$^{-1}$, more preferably said electrical current has a linear sweep voltammetry sweeping speed of from about 0.01 mV s$^{-1}$ to about 250 mV s$^{-1}$, more preferably said electrical current has a linear sweep voltammetry sweeping speed of from about 0.1 mV s$^{-1}$ to about 200 mV s$^{-1}$, most preferably said electrical current has a linear sweep voltammetry sweeping speed of from about 1 mV s$^{-1}$ to about 200 mV s$^{-1}$. For example, the desulfurization of multilayer $MoS_2$ samples is achieved by electrochemical desulfurization conducted in an electrochemical cell with 0.5 M sulfuric acid ($H_2SO_4$).

h.) surface physical modification of at least a portion of said coated substrate's pattern illumination-based annealed chemical coating including but not limited to ball milling or polishing.

Applicants disclose a process of making electrical device, an optical device or a combined electrical and optical device, said process comprising combining:

a) two or more electrical, an optical or a combined electrical and optical components produced according to the process of paragraphs twenty-eight through forty-five; or b) at least one electrical, optical or combined electrical and optical component produced according to the process of paragraphs twenty-eight through forty-five, and one or more additional electrical, optical or combined electrical and optical components. Said one or more additional electrical, optical or combined electrical and optical components are not produced according to the processes of paragraphs twenty-eight through forty-five.

Applicants disclose an electrical device, an optical device or a combined electrical and optical device comprising a pattern illumination-based annealed, coated substrate comprising a substrate having a first side and a second side, a.) said substrate's first side comprising;

(i) one or more coatings of patterned electrical conductive material disposed over said substrate's first side, preferably said patterned electrical conductive material comprises a material selected from the group consisting of poly(3,4-ethylenedioxythiophene), poly(3,4-ethylenedioxythiophene) polystyrene sulfonate, poly(pyrrole), polycarbazoles, polyindoles, polyazepines, Cr, Mo, Ti, Sc, Ni, V, Hf, W, Nb, Au, Ag, Cu, and Pt and mixtures thereof; more preferably said patterned electrical conductive material comprises a metal selected from the group consisting of Cr, Mo, Ti, Sc, Ni, V, Hf, W, Nb, Au, Ag, Cu, and Pt and mixtures thereof, most preferably said metal comprises a metal selected from the group consisting of Mo, Cr, Ti, Au and mixtures thereof, most preferably said one or more coatings of patterned electrical conductive material is a coating of Mo, a coating of Cr and a second coating of Au over said coating of Cr or a coating of Ti and a second coating of Au over said coating of Ti; and (ii) one or more chemical coatings disposed over said one or more coatings of patterned electrical conductive material, said one or more chemical coatings each independently comprising a transition metal and an element selected from the group consisting of hydrogen, carbon, nitrogen, oxygen, sulfur, selenium, phosphorous and mixtures thereof, preferably said one or more chemical coatings each independently comprises a transition metal and an element selected from the group consisting of oxygen, sulfur, selenium and mixtures thereof, said one or more chemical coatings each independently comprising at least one of an amorphous, nanocrystalline, microcrystalline or crystalline region, preferably said chemical coatings comprises one or more transition metal dichalcogenides, preferably said one or more transition metal dichalcogenides are selected from the group consisting of $MoS_2$, $WS_2$, $MoSe_2$, $WSe_2$, and mixtures thereof, at least a portion of said one or more chemical coatings being a pattern illumination-based annealed chemical coating;

b.) said substrate's second side optionally comprising:

(i) one or more coatings of patterned electrical conductive material disposed over said substrate's first side, preferably said patterned electrical conductive material comprises a material selected from the group consisting of poly(3,4-ethylenedioxythiophene), poly(3,4-ethylenedioxythiophene) polystyrene sulfonate, poly(pyrrole), polycarbazoles, polyindoles, polyazepines, Cr, Mo, Ti, Sc, Ni, V, Hf, W, Nb, Au, Ag, Cu, and Pt and mixtures thereof; more preferably said patterned electrical conductive material comprises a metal selected from the group consisting of Cr, Mo, Ti, Sc, Ni, V, Hf, W, Nb, Au, Ag, Cu, and Pt and mixtures thereof, most preferably said metal comprises a metal selected from the group consisting of Mo, Cr, Ti, Au and mixtures thereof, most preferably said one or more coatings of patterned electrical conductive material is a coating of Mo, a coating of Cr and a second coating of Au over said coating of Cr or a coating of Ti and a second coating of Au over said coating of Ti; and (ii) one or more chemical coatings disposed over said one or more coatings of patterned electrical conductive material, said one or more chemical coatings each independently comprising a transition metal and an element selected from the group consisting of hydrogen, carbon, nitrogen, oxygen, sulfur, selenium, phosphorous and mixtures thereof, preferably said one or more chemical coatings each independently comprises a transition metal and an element selected from the group consisting of oxygen, sulfur, selenium and mixtures thereof, said one or more chemical coatings each independently comprising at least one of an amorphous, nanocrystalline, microcrystalline or crystalline region, preferably said chemical coatings comprises one or more transition metal dichalcogenides, preferably said one or more transition metal dichalcogenides are selected from the group consisting of $MoS_2$, $WS_2$, $MoSe_2$, $WSe_2$ and mixtures thereof, at least a portion of said optional one or more chemical coatings being a pattern illumination-based annealed chemical coating.

Applicants disclose the electrical device, an optical device or a combined electrical and optical device comprising a pattern illumination-based annealed, coated substrate of paragraph forty-seven comprising at least one of:

a.) at least one chemical coating comprising two or more regions that are amorphous, nanocrystalline, microcrystalline or crystalline with the proviso that at least two of said regions are not identical with respect being amorphous, nanocrystalline, microcrystalline or crystalline, at least two of said regions being pattern illumination-based annealed via different pattern illumination-based annealing processes; or b.) at least one chemical coating comprising at least one region that is amorphous, nanocrystalline, microcrystalline or crystalline said at least one region being pattern illumination-based annealed two or more times. The device of paragraphs forty-seven through forty-eight could be produced in accordance with the processes of paragraphs twenty-eight through forty-six.

Applicants disclose the device of paragraphs forty-seven through forty-eight wherein:

a.) said substrate of said coated substrate is selected from glass, polymer and mixtures thereof, preferably said polymer is selected from the group consisting of polyethylene naphthalate, polyimide, polycarbonate, polyethylene naphthalate and mixtures thereof;

b) said one or more coatings of patterned electrical conductive material is a coating of Mo, a coating of Cr and a second coating of Au over said coating of Cr or a coating of Ti and a second coating of Au over said coating of Ti; and c) said one or more chemical coatings comprises a material selected from the group consisting of $MoS_2$, $WS_2$, $MoSe_2$, $WSe_2$ and mixtures thereof Suitable amorphous, nanocrystalline, microcrystalline and/or crystalline materials comprising a transition metal and hydrogen, carbon, nitrogen, oxygen, sulfur, selenium, tellurium, and/or phosphorous can be obtained from Plasmaterials (2268 Research Drive, Livermore, CA 94550 USA) and Kurt Lesker (1925 Route 51, Jefferson Hills, PA 15025 USA.

Patterned metal on silicon or glass wafers can be obtained from Sil'tronix (382 rue Louis Rustin, Technopole d'Archamps, 74160 Archamps, France) or University Wafer (11 Elkins Street, Unit 330, South Boston, MA 02127). Patterned metal on polymer substrates, including polyimide, polycarbonate, polyethylene naphthalate and polyethylene terephthalate may be obtained from VAST Films LTD (13525 Youngstown-Pittsburgh Rd, Petersburg, OH 44454).

Suitable continuous wave lasers for conducting Applicants can be obtained from Thorlabs (56 Sparta Avenue, Newtown, NJ 07860 USA), Coherent (5100 Patrick Henry Dr., Santa Clara, CA 95054 USA), and TLM Laser Ltd (Navigation Court, Harris Business Park, Stoke Prior, Bromsgrove, Worcestershire, B60 4FD UK). Pulsed lasers suitable for the applications described here include the Keyence MDX series of laser models obtained from Keyence Corporation (720 South Colorado Boulevard, Suite 650-S Denver, Colorado 80246A) which is capable of a selected range of pulse lengths between microseconds to milliseconds. Lasers with femtosecond and picosecond pulse widths suitable for the applications described here are available from Control Micro Systems (CMS) Laser (4420-A Metric Drive Winter Park, FL 32792). Lamps with characteristics suitable for the applications described here include the Pulse Forge 3300 model by manufactured by Novacentrix (400 Parker Dr. Suite 1110, Austin, TX).

Devices Comprising Electronic and/or Optical Components

The components for electronic and optical devices that are made by Applicants' process can be used in a variety of electronic and optical devices. In general such electronic and optical devices are produced by incorporating one or more of the components made by Applicants' processes into the subject electronic and/or optical devices. Suitable ways of incorporating current components, made by processes other than Applicants' processes, are provided in U.S. Pat. No. 3,138,743 that relates to miniaturized electronic circuits, U.S. Pat. No. 5,515,241 that relates connecting integrated circuits and U.S. Pat. No. 5,526,280 that relates to a gas sensor circuit.

EXAMPLES

The following examples illustrate particular properties and advantages of some of the embodiments of the present invention. Furthermore, these are examples of reduction to this is the laser writing of a chemresistor style gas sensor that can detect ammonia at sub 10 ppm levels. This chemresistor was composed of a semiconducting crystalline $MoS_2$ channel, metallic contact pads and electrodes, and a $MoO_3$ boundary isolation and was demonstrated to detect 10, 100, and 1000 parts per million of $NH_3$ gas.

Example 3: The first five materials listed in Column 4 of Table 1 below were made in accordance with Applicants' process on metallic contacts using a laser and then the same results were obtained using a lamp. Such materials are useful as listed in Column 5 of Table 1. The last 6 materials listed in Column 3 of Table 1 below are made in accordance with Applicants' process using a laser and then the same results were obtained using a lamp. Such materials are useful as listed in Column 5 of Table 1. The Examples in Table 1 row 1, 2, 5, 9 and 10 of column 4 show a crystalline structure changes in the starting material as represented by 2H, 1T, T-Phase and H-Phase while Examples in Table 1 row 3, 4, 6, 7, 8 and 9 of column 4 show a chemical change in the starting material.

TABLE 1

| Starting Material | Fluid blanket | Methodology | Post-annealed material | Use |
|---|---|---|---|---|
| Amorphous $MoS_2$ | Vacuum | Crystallization | $2H\text{-}MoS_2$ | Semiconductor |
| | Vacuum | Crystallization | $1T\text{-}MoS_2$ | Conductor |
| | Oxygen gas | Oxidation (Shorter annealing time) | $MoO_2$ | Conductor |
| | Oxygen gas | Oxidation (longer annealing time) | $MoO_3$ | Insulator |
| Amorphous $WS_2$ | Vacuum | Crystallization | $2H\text{-}WS_2$ | Semiconductor |
| Amorphous TiS | Oxygen gas | Oxidation | TiO | Conductor |
| | Oxygen gas | Oxidation | $TiO_2$ | Semiconductor |
| | Nitrogen gas | Nitridization | TiN | Conductor |
| Amorphous $VS_2$ | Vacuum | Crystallization | T-phase $VS_2$ | Insulator |
| | Vacuum | Crystallization | H-phase $VS_2$ | Semiconductor |
| | Oxygen gas | Oxidation | $VO_2$ | Insulator | practice of the present invention and confirmation that the principles described in the present invention are therefore valid but should not be construed as in any way limiting the scope of the invention.

Example 1: Laser Written resistor and capacitor in thin film molybdenum disulfide. A molybdenum disulfide ($MoS_2$) thin film of thickness totaling 900±50 nm was deposited onto a metal patterned glass or $SiO_2$ wafer via magnetron sputtering using a 99.95% pure $MoS_2$ target and Ti/Au contacts. The direct laser writing of resistors and capacitors was possible using a 514 nm laser and creating conducting $MoO_2$ patterns and insulating $MoO_3$ isolation with the Ti/Au contacts. The resistance can be controlled in a resistor component by varying the length of conductive material within the amorphous material, with the required $MoO_3$ isolation surrounding. Additionally, comb capacitors shown with tailored electronic properties are possible via patterning of the same materials but in different configurations.

Example 2: Gas sensor laser written in molybdenum disulfide Active circuit elements were also possible using the laser writing technique by taking advantage of the on/off properties of semiconducting $2H\text{-}MoS_2$. One example of Example 4. P-N Junction with Laser Written $MoS_2$/$WSe_2$ Lateral P-N junctions are made possible through first deposition of metallic contacts followed by patterned amorphous deposition of in-plane heterojunctions of amorphous $MoS_2$/$WSe_2$ structures. With the use of one laser pass across the interface, a n-type semiconductor $MoS_2$ is in contact with a p-type $WSe_2$ semiconductor material, forming a P-N junction of use for light emitting diodes (LEDs) and other optical/electronic components.

Example 5: Sensor device with laser written $MoS_2$, patterned metal contacts and patterned ablated material. Multiplexed sensor devices require electrical isolation to ensure minimal cross-talk between laser written devices. With this in mind, laser patterned areas of crystallized $MoS_2$ were fabricated and the same laser was used to trace around the area that was annealed to remove all material within that region in creating an electrically isolated circuit. The ablation process removed in total about 1% area of the total $MoS_2$ film.

Figure 2:
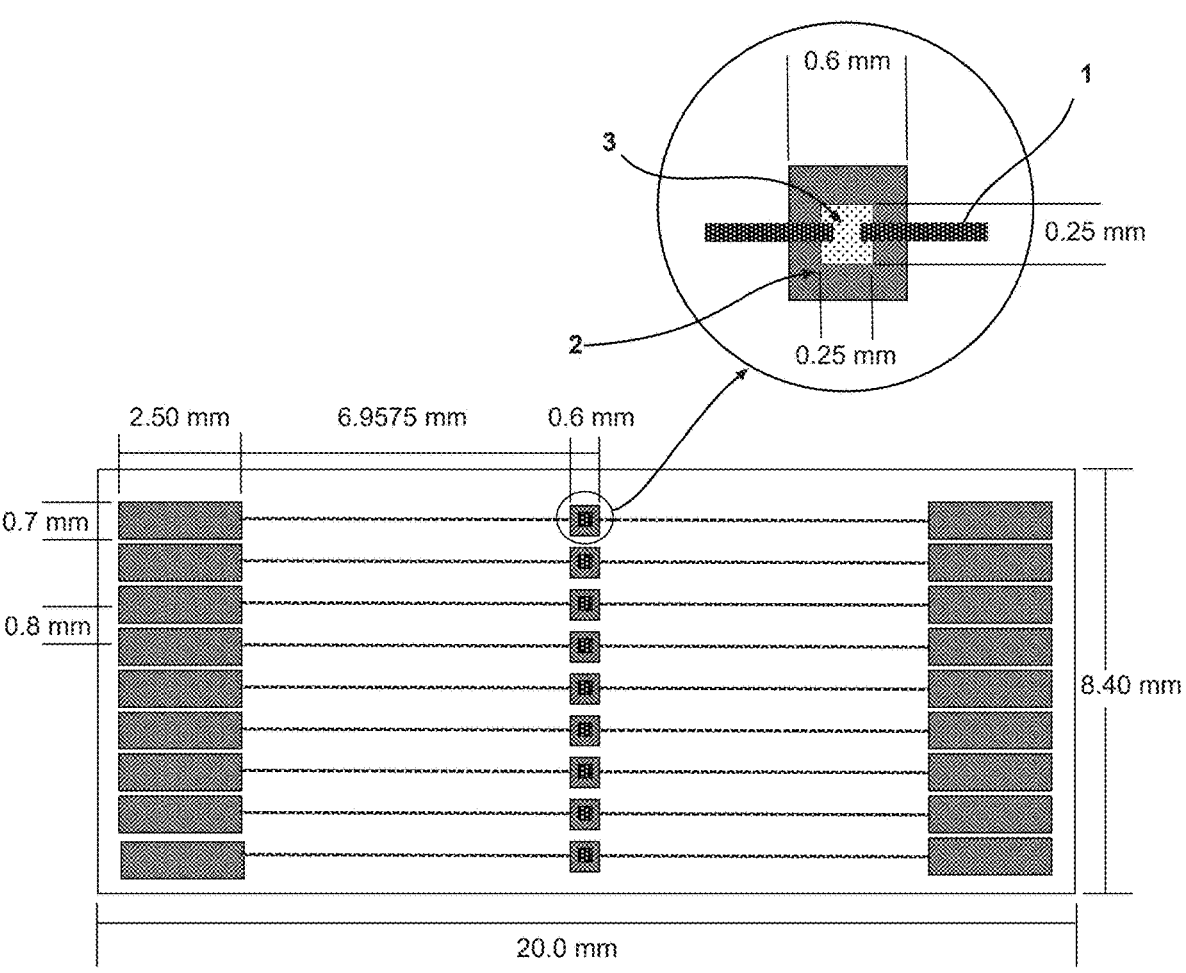
FIG. 2 is an example laser processed device configuration with deposited $MoS_2$ on prepatterned metal contacts and subsequent conversion showing in additional detail Metal electrodes (1), Amorphous $MoS_2$ (2) and Laser crystallized $MoS_2$ (3)
Figure 3A:
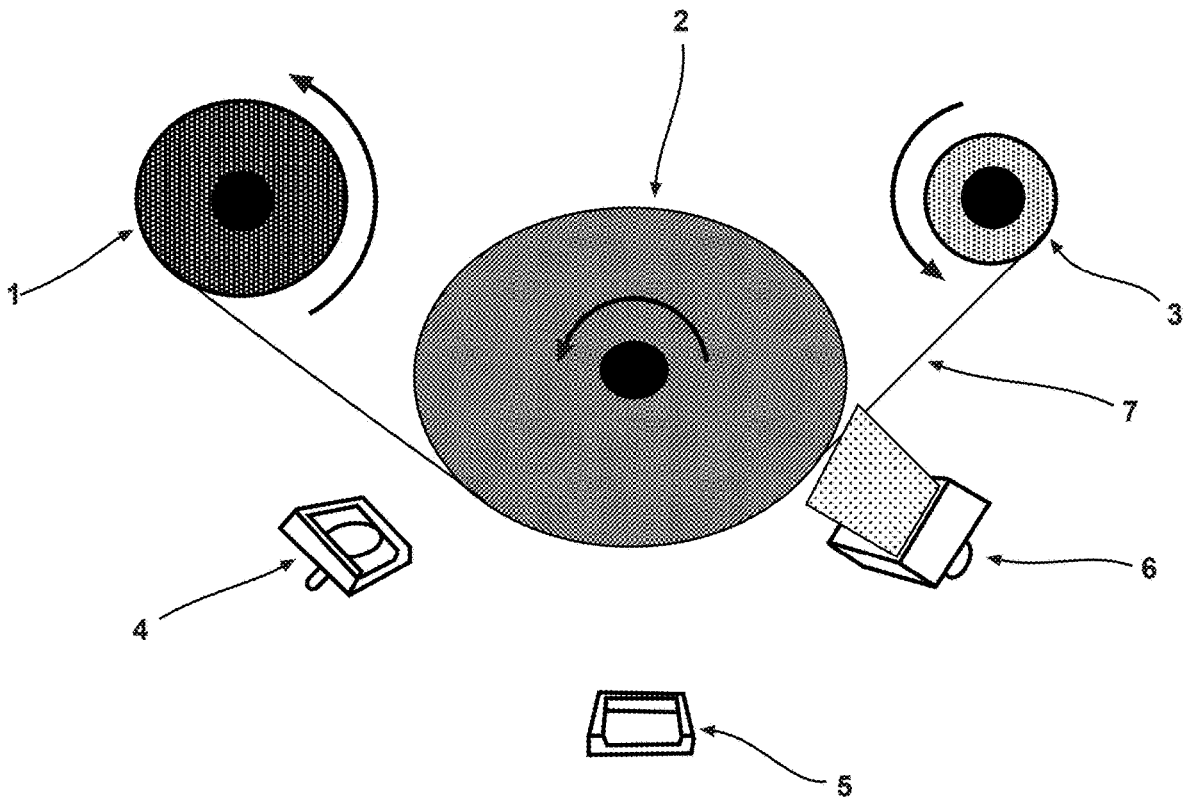
FIG. 3A is an example of the first unit operation in a roll-to-roll deposition of $MoS_2$ onto metal patterned substrates with subsequent laser annealing showing Feed roll (1), Main roller (2), Receiving roller (3), $MoS_2$ sputtering target (4), Laser (5), Metal sputtering target (6) and Flexible glass substrate (7).
Figure 3B:
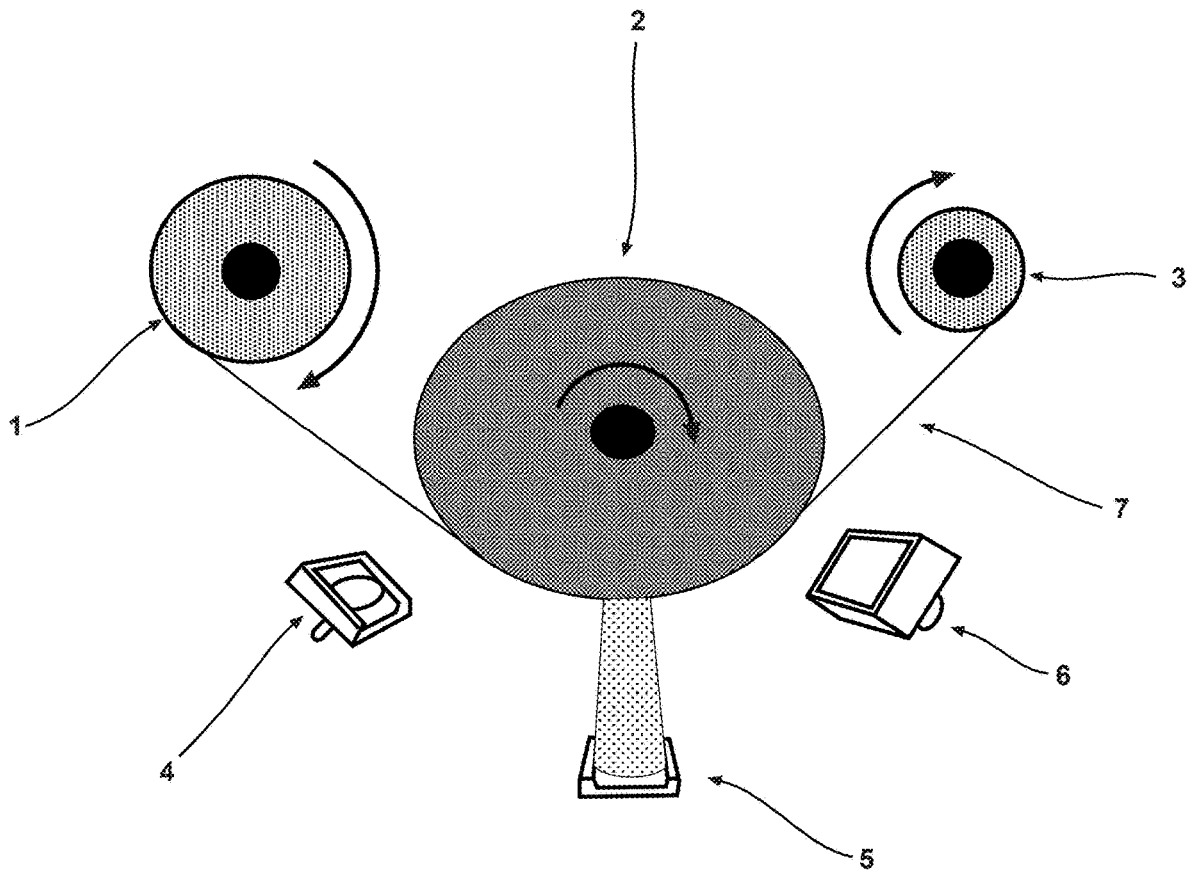
FIG. 3B is an example of a second unit operation in a roll-to-roll deposition of $MoS_2$ onto metal patterned substrates with subsequent laser annealing showing Receiving roll (1), Main roller (2), Feed roll (3), $MoS_2$ sputtering target (4), Laser (5), Metal sputtering target (6), and Flexible glass substrate (7).
Figure 3C:
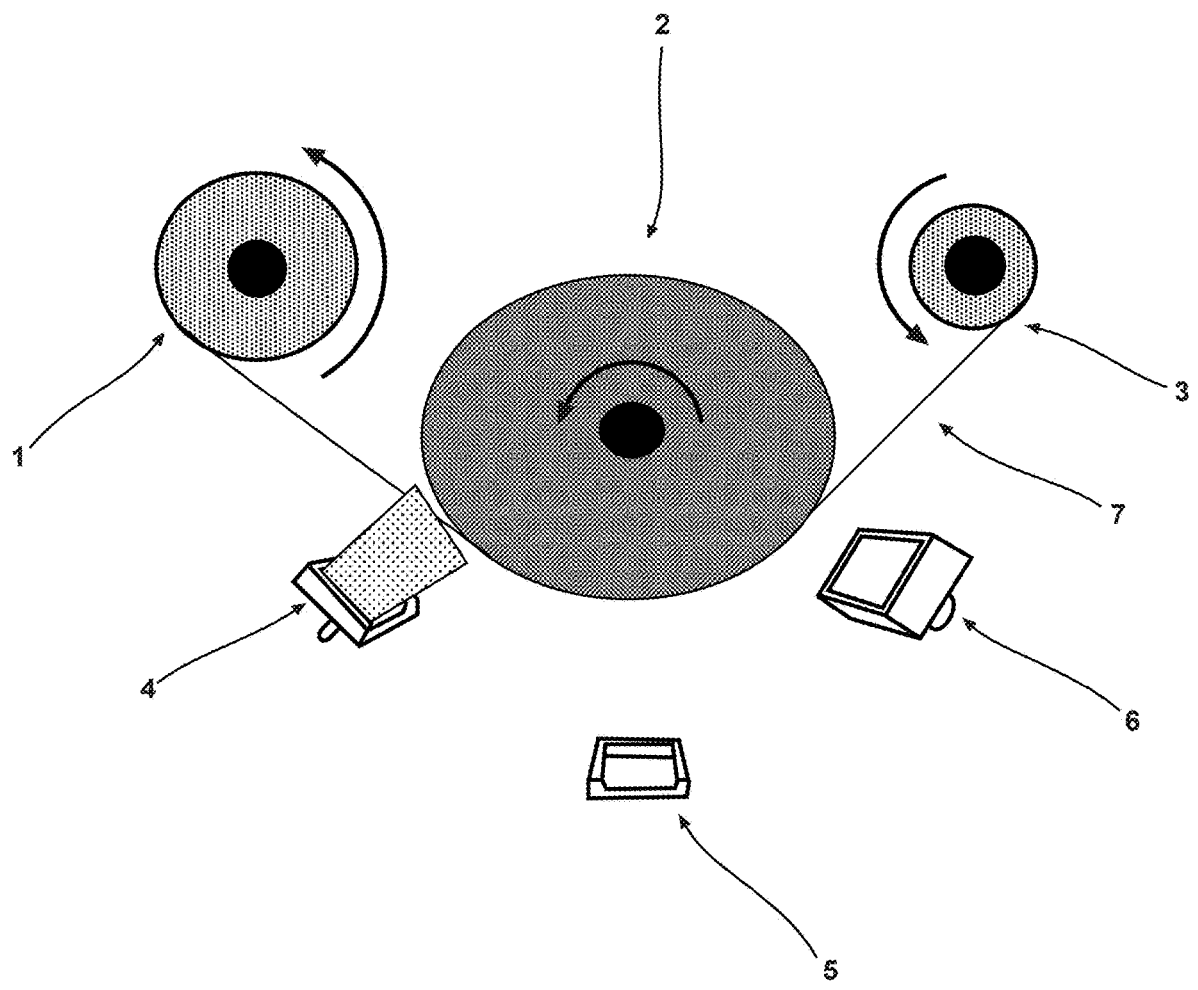
FIG. 3C is an example of a third unit operation in a roll-to-roll deposition of $MoS_2$ onto metal patterned substrates with subsequent laser annealing showing Feed roll (1), Main roller (2), Receiving roller (3), MoS$_2$ sputtering target (4), Laser (5), Metal sputtering target (6), and Flexible glass substrate (7).
Figure 3D:
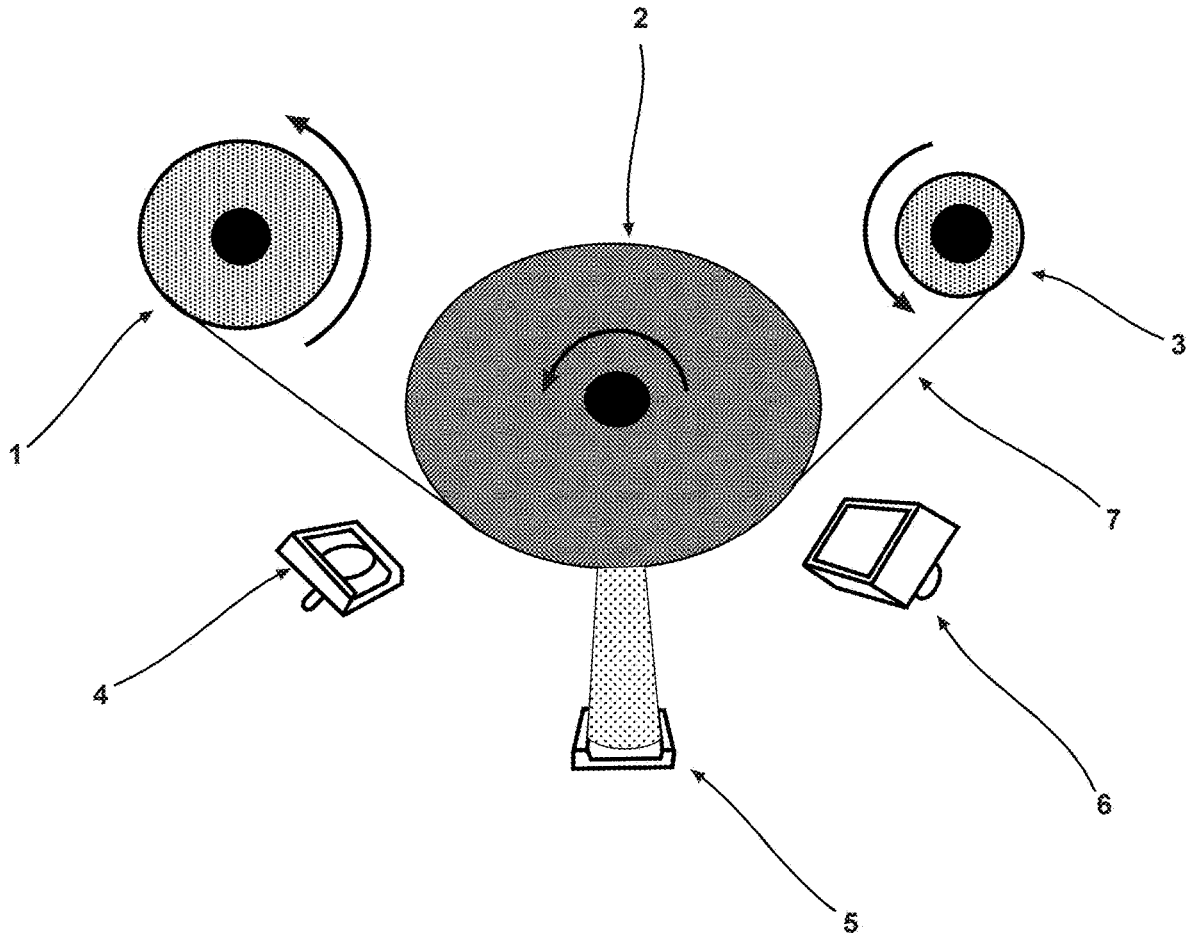
FIG. 3D is an example of a fourth unit operation in a roll-to-roll deposition of MoS$_2$ onto metal patterned substrates with subsequent laser annealing showing Receiving roll (1), Main roller (2), Feed roll (3), MoS$_2$ sputtering target (4), Laser (5), Metal sputtering target (6), and Flexible glass substrate (7).
Figure 4:
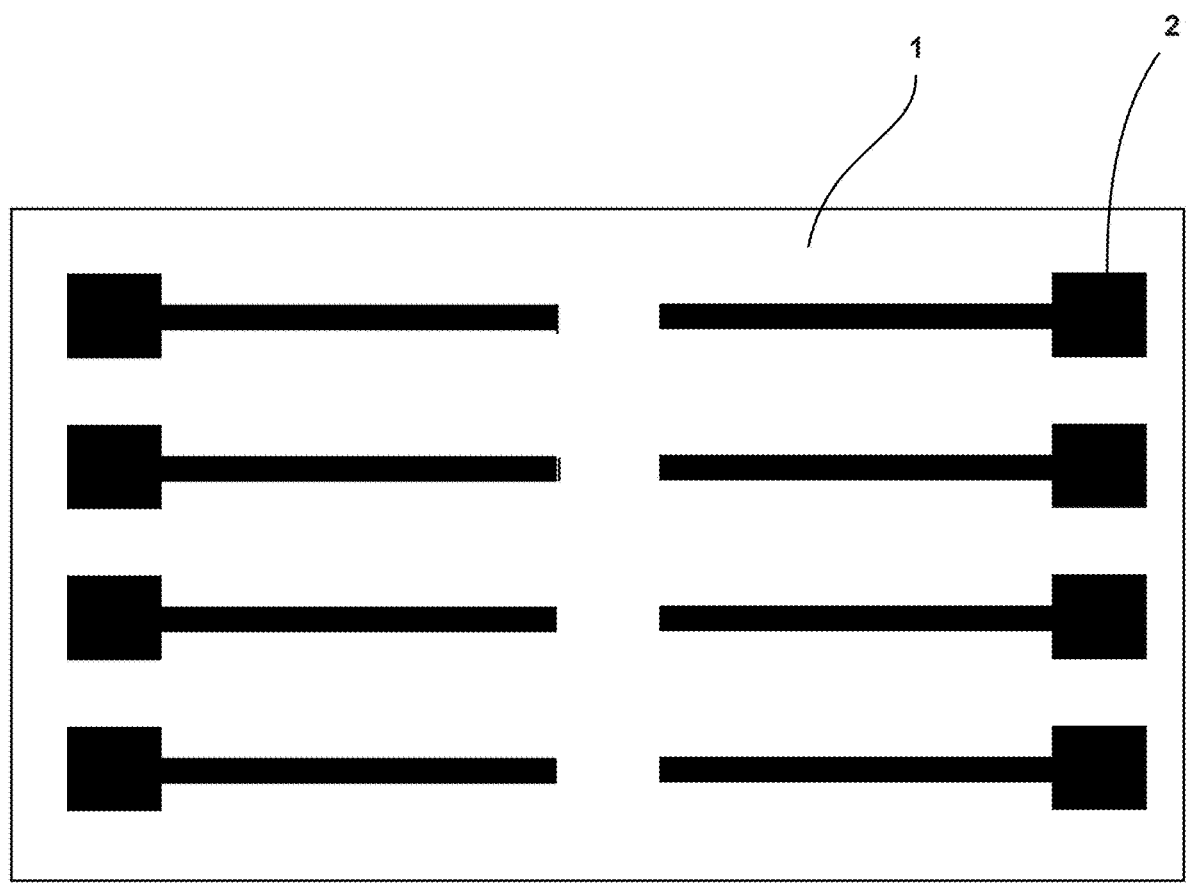
FIG. 4 is an example of a pattern for the pattern illumination-based annealed, coated substrate's patterned electrical conductive material (2) on a substrate (1) of the present invention.
Figure 5:
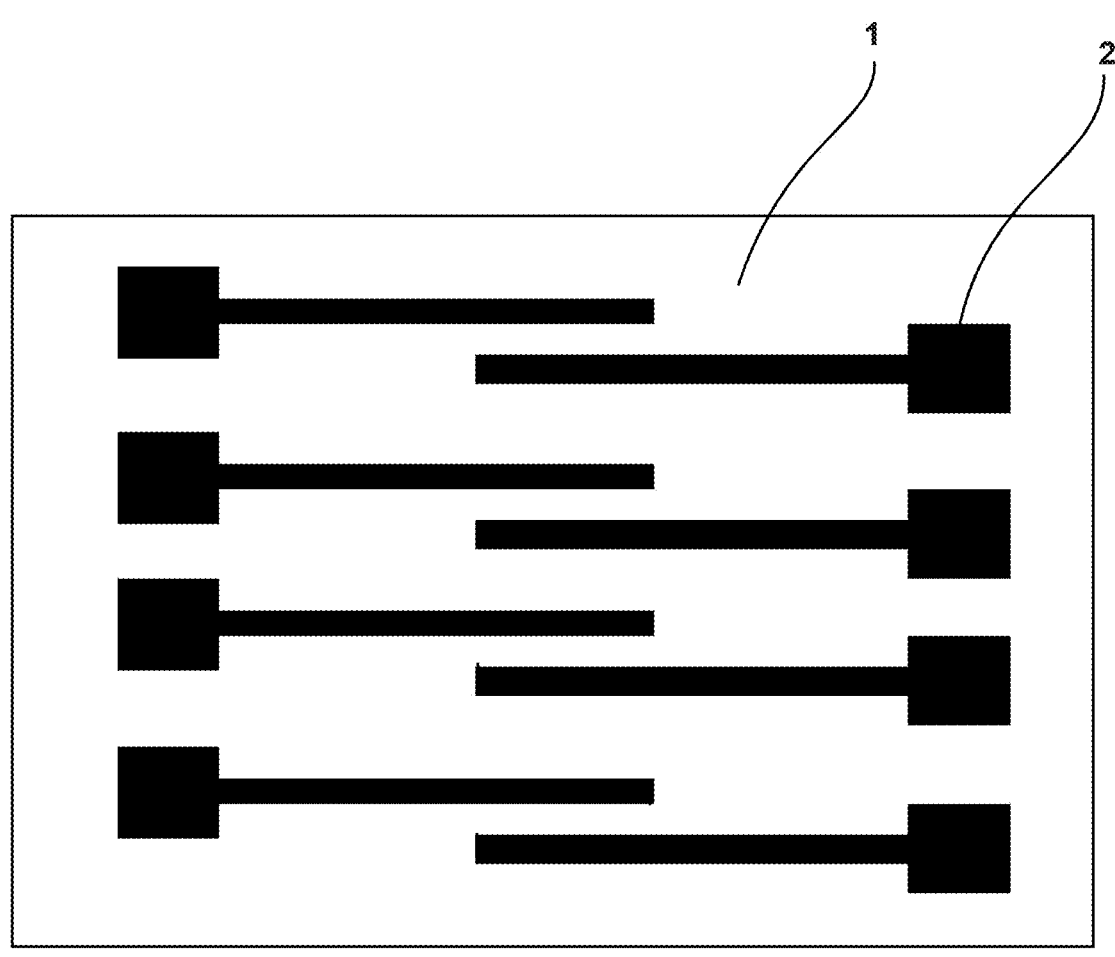
FIG. 5 is an example of a pattern for the pattern illumination-based annealed, coated substrate's patterned electrical conductive material (2) on a substrate (1) of the present invention.
Figure 6:
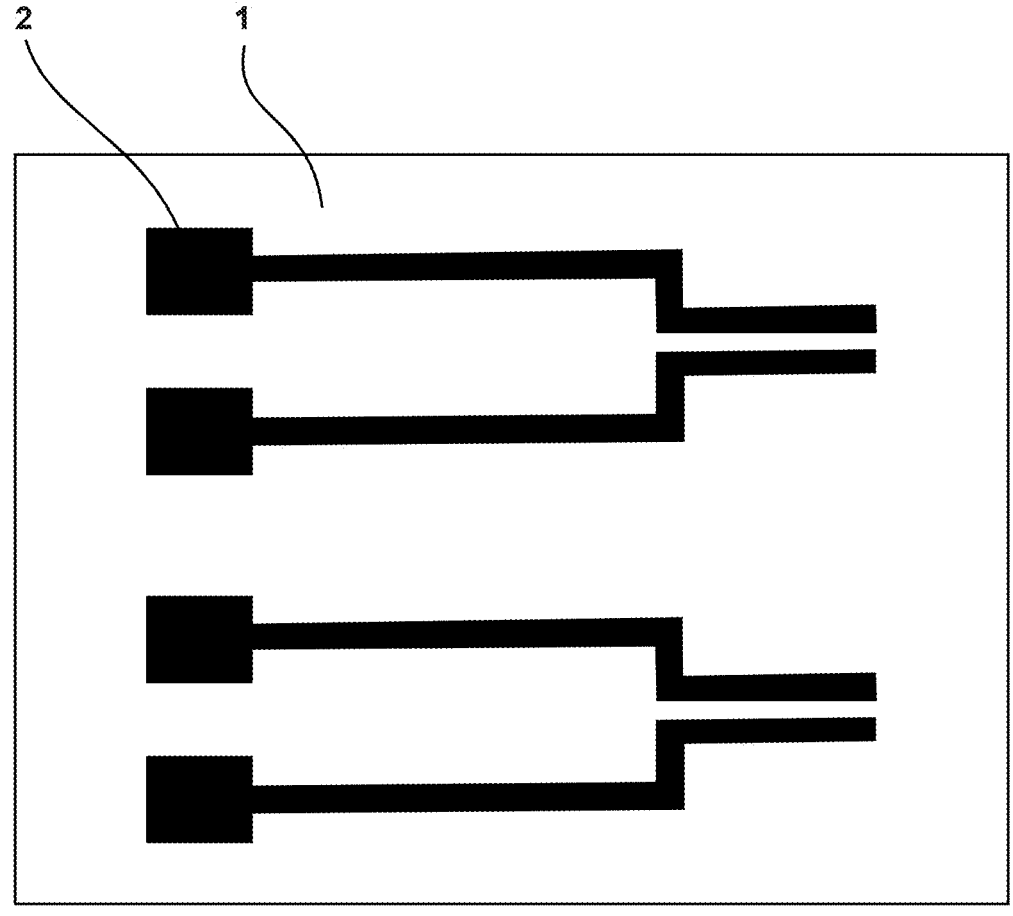
FIG. 6 is an example of a pattern for the pattern illumination-based annealed, coated substrate's patterned electrical conductive material (2) on a substrate (1) of the present invention.
Figure 7:
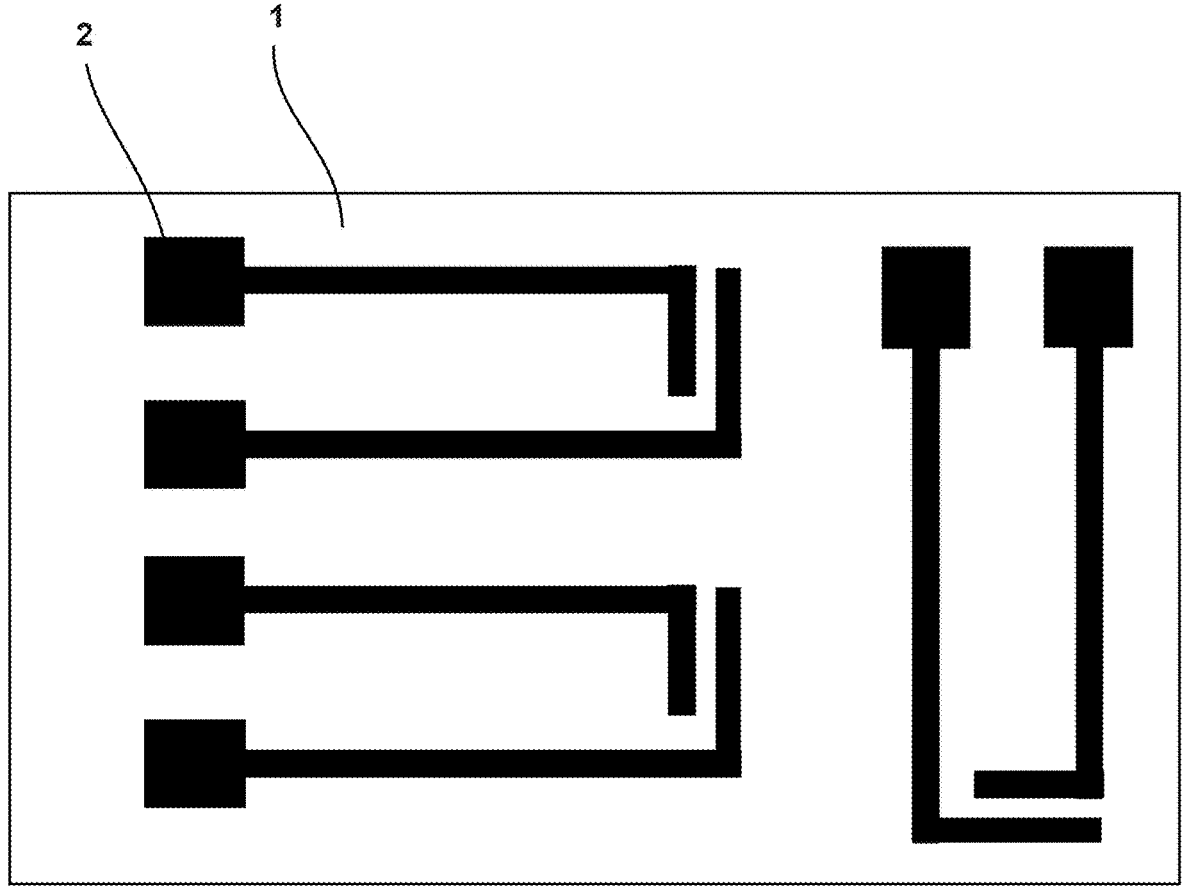
FIG. 7 is an example of a pattern for the pattern illumination-based annealed, coated substrate's patterned electrical conductive material (2) on a substrate (1) of the present invention.
Figure 8:
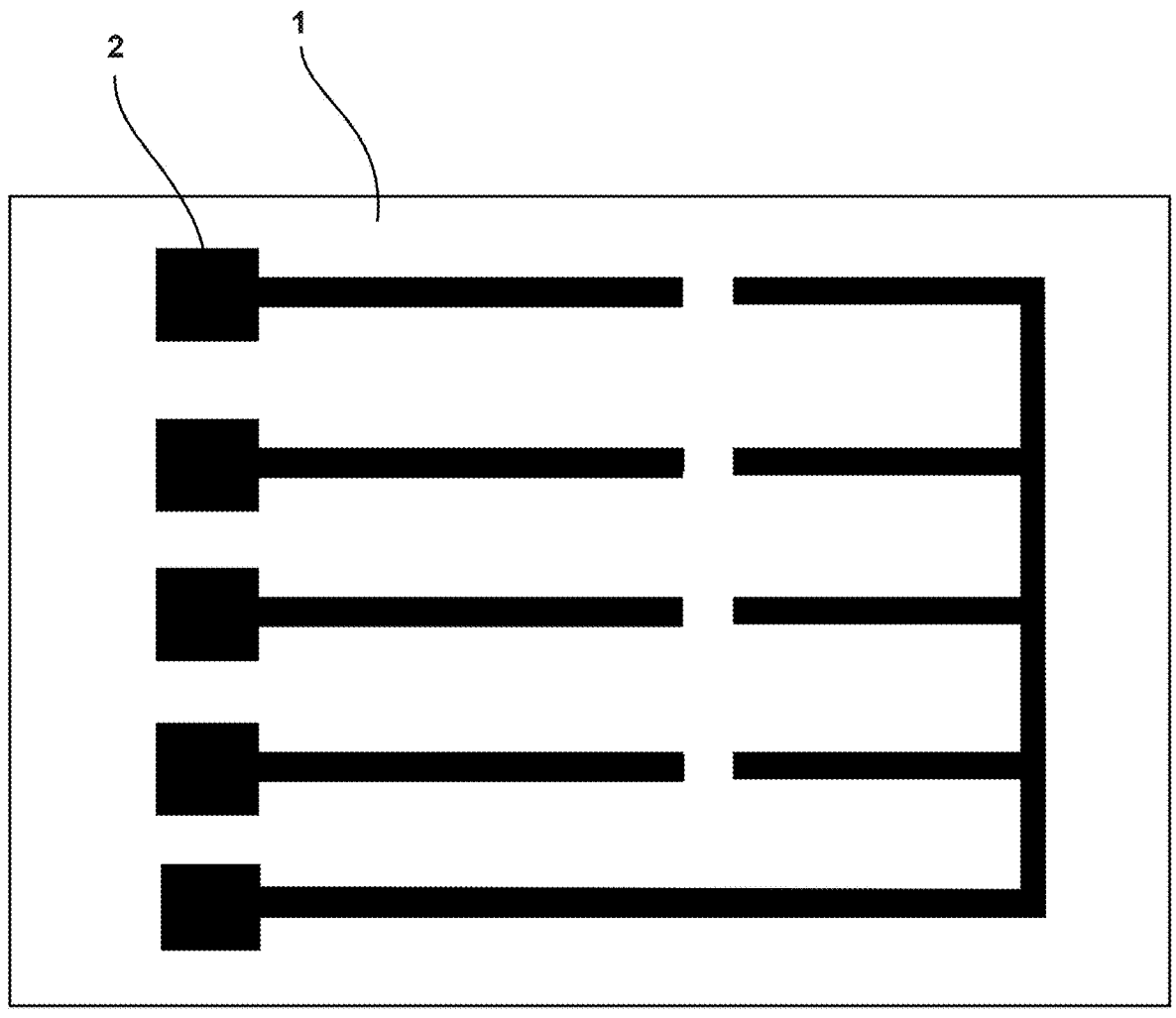
FIG. 8 is an example of a pattern for the pattern illumination-based annealed, coated substrate's patterned electrical conductive material (2) on a substrate (1) of the present invention.
Figure 9:
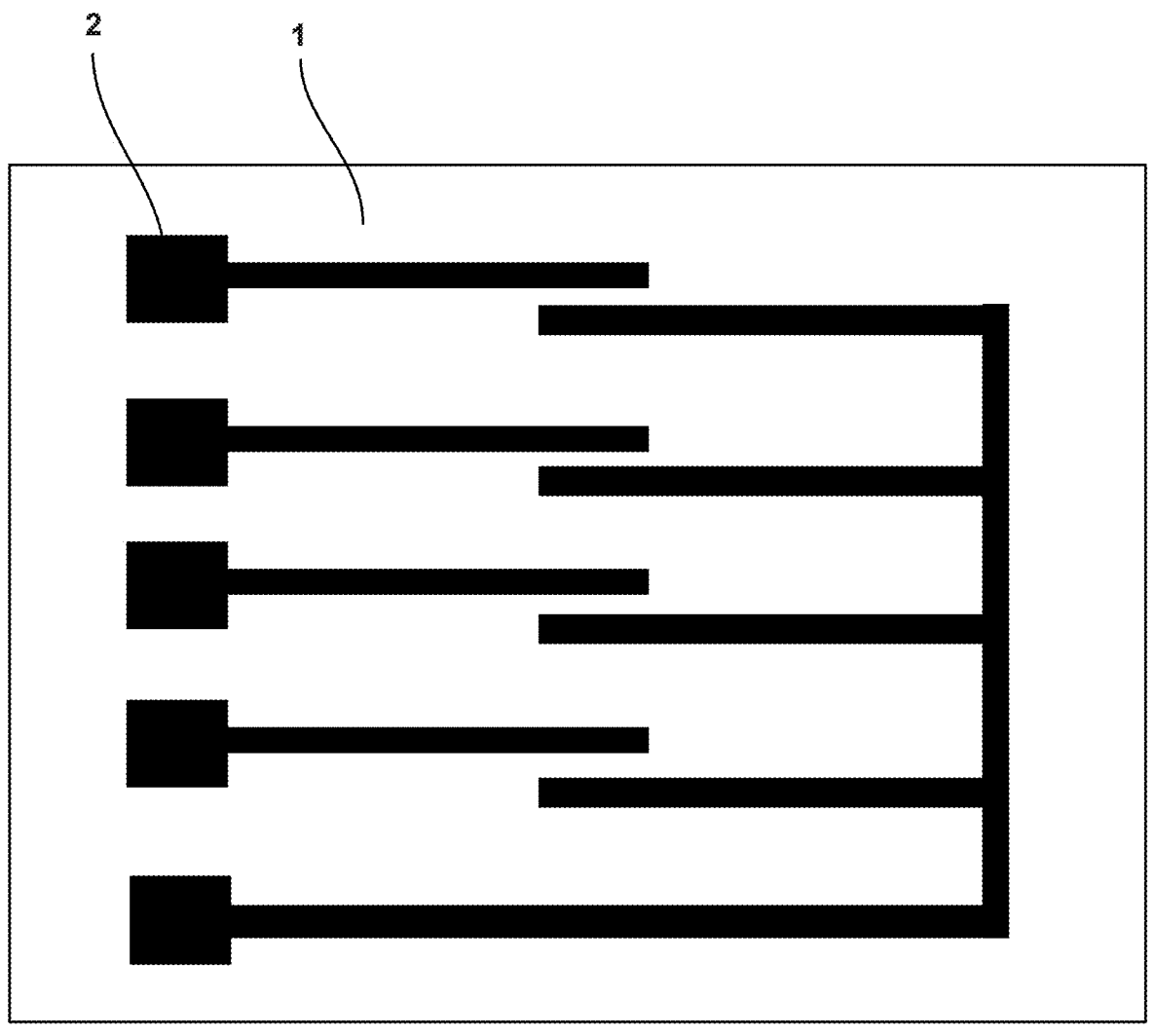
FIG. 9 is an example of a pattern for the pattern illumination-based annealed, coated substrate's patterned electrical conductive material (2) on a substrate (1) of the present invention.

Example 6: Laser written chemical or biological sensor on e-beam evaporated patterned metal on glass substrate. A prepatterned metal film composed of gold or molybdenum metal in a pattern was first deposited on a glass substrate as depicted in FIG. 1 and FIG. 2. A thin 3 nm molybdenum disulfide film is then sputter coated onto the glass/patterned metal substrate to form a continuous thin film. A CW laser is then utilized to crystallize the amorphous $MoS_2$ film to convert into semiconducting $2H-MoS_2$ for sensing applications. The chemical sensor is then electrically isolated through laser ablation removal of the amorphous $MoS_2$ film around the crystallized $2H-MoS_2$ to form a chem/bio sensor configuration.

Example 7: All laser written sensor on ablated metal pattern in roll-to-roll configuration. A roll-to-roll process is utilized to run a spool of flexible glass through a sputter-coater, laser processing system as depicted in FIG. 3. First, a thin layer of molybdenum or gold metal is deposited over the entire glass substrate and the laser is used to ablate a pattern in such a configuration as identified in FIG. 3. The laser-ablated patterned metal film is then coated with 3 nm $MoS_2$ over the entire glass/metal substrate. Immediately following, a laser ablation step is used to remove all or some fraction of the amorphous $MoS_2$ except an area connecting the metal contacts, which is then laser annealed at a lower laser energy condition than that used for ablation to induce crystallization in a phase such as the hexagonal $2H-MoS_2$ formation. The resultant devices are an embodiment of an all-laser fabrication roll-to-roll approach for chem/bio sensor fabrication.

Example 8: Thick $MoS_2$ with laser annealing and metal contacts occurring on or within the film to form 3D device. A thick (100 micrometers) amorphous film of $MoS_2$ is deposited onto a glass substrate with patterned metal contacts. A sensor device is laser annealed into the film, occurring in several stepwise procedures both at the surface of the film and within the depth. First, an area of the film outside of the active device area is laser ablated where the entirety of the film is removed in select areas. Within the remaining film, a focused nanosecond laser is used to crystallize the surface of $MoS_2$ (<1 micrometer) for the active region of the sensor, leaving the remaining 99% within the thickness unaltered. Then, a continuous wave laser is used to oxidize regions of the film through the entire thickness in order to form conductive $MoO_3$ to serve as isolation in a multiplex sensor device.

Example 9: $MoS_2$ sensor with modified channel material to increase defects and surface roughness. A thin amorphous $MoS_2$ coating is first deposited on a glass substrate. A channel region is laser annealed to form 2H semiconducting $MoS_2$ and a subsequent laser annealing step is used to write contacts of $MoO_2$ and isolation of $MoO_3$. Finally, a second laser annealing step is then performed to induce sulfur vacancies in the $MoS_2$ film in the form of defects and also increase surface roughness in improving and accommodating attachment of subsequent molecules to the surface. The entire chip is then annealed at 100° C. to induce some surface oxidation in order to improve p-type performance of the device.

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and process, and illustrative examples shown and described. Accordingly, departures may be made from such details without departing from the scope of the general inventive concept.

What is claimed is:

1. A process of making an electrical component, an optical component or a combined electrical and optical component, said process comprising:

a) applying one or more coatings of electrically conductive material to a substrate having a first side and a second side, said one or more coatings of electrically conductive material being applied to at least the first side of said substrate;

b) using a laser to remove a portion of said electrically conductive material to form a pattern of electrically conductive material electrodes on said substrate;

c) applying one or more chemical coatings in the form of a continuous film over said patterned electrical conductive material to form a coated substrate, wherein (i) said patterned electrical conductive material comprises a material selected from the group consisting of poly(3,4-ethylenedioxythiophene), poly(3,4-ethylenedioxythiophene) polystyrene sulfonate, poly (pyrrole), polycarbazoles, polyindoles, polyazepines, Cr, Mo, Ti, Sc, Ni, V, Hf, W, Nb, Au, Ag, Cu, and Pt and mixtures thereof;

(ii) said one or more chemical coatings each independently comprising a transition metal and an element selected from the group consisting of hydrogen, carbon, nitrogen, oxygen, sulfur, selenium, phosphorous and mixtures thereof, said one or more chemical coatings each independently comprising at least one of an amorphous, nanocrystalline, microcrystalline or crystalline region; and d) pattern illumination-based annealing said coated substrate, said pattern illumination-based annealing comprising using one or more lasers and/or lamps to achieve at least one of a chemical change or change in crystallization in at least a portion of at least one of said one or more chemical coatings on at least one side of said substrate, wherein said chemical change or change in crystallization changes said at least said portion to a semiconducting material, which semiconducting material is in contact with the underlying patterned electrical conductive material that was formed on said substrate.

2. A process of making an electrical component, an optical component or a combined electrical and optical component according to claim 1 wherein:

at least one of said one or more chemical coatings comprises, prior to said annealing, two or more regions that are amorphous, nanocrystalline, microcrystalline or crystalline with the proviso that at least two of said regions are not identical with respect to being amorphous, nanocrystalline, microcrystalline or crystalline and said laser or lamp forms on, within or on and within said at least one of said one or more chemical coatings:

(i) at least two electronic elements selected from a conductor, semiconductor and an insulator;

(ii) two or more different conductors having at least one of the following: different electrical properties or different optical properties;

(iii) two or more different semiconductors having at least one of the following: different electrical properties or different optical properties; or (iv) two or more different insulators having at least one of the following: different electrical properties or different optical properties;

said process being performed under one of the following conditions: vacuum of less 100 torr, air, or under a fluid blanket other than air; and said pattern illumination-based annealing resulting in at least one of a chemical change or a change in crystallinity, or the removal of at least a portion of at least one of said one or more chemical coatings and resulting in an electrical component, an optical component or a combined electrical and optical component being formed on, within or on and within at least a portion of said pattern illumination-based annealed one or more chemical coatings.

3. The process of claim 1 further comprising performing steps a) to d) on the second side of said substrate as well.

4. The process of claim 1 wherein said transition metal is selected from the group consisting of molybdenum, tungsten, niobium, tantalum, vanadium, titanium, chromium, iron, rhodium, hafnium, rhenium and mixtures thereof.

5. A process according to claim 1 wherein said one or more chemical coatings comprises at least one region that is crystalline or nanocrystalline.

6. The process of claim 1 wherein, said electrical and/or optical component is selected from the group consisting of: an inductor, a capacitor, a resistor, a diode, a trace, a battery, an optical filter, a chemical sensor, a biological sensor, and a solar cell.

7. The process of claim 1 wherein said pattern illumination-based annealing in step d) further comprises removal of at least a portion of said chemical coating on at least one side of said substrate, and each of said one or more chemical coatings have an area and a thickness and said removal of said at least a portion of said one or more chemical coating occurs, said removal comprising at least one of:

a.) laser ablation removal of from about 0.1% to about 99.9% of at least one of said one or more chemical coatings' area; or b.) laser ablation removal of at least 85% of at least one of said chemical coatings' thickness; or laser ablation removal of about 85% to about 99% of at least one of said chemical coatings' thickness.

8. The process of claim 1, said process being a roll process wherein said coated substrate is a rolled coated substrate that is unrolled at least in part, said unrolled chemically coated portion of said coated substrate being at least in part pattern illumination-based annealed.

9. The process of claim 1 step a) consists of applying a single coating of electrically conductive material to at least the first side of said substrate, and step c) consists of applying a single chemical coating in the form of a continuous film over said patterned electrical conductive material to form a coated substrate.

10. A process according to claim 1 wherein at least a portion of said coated substrate's pattern illumination-based annealed chemical coating is further treated by at least one of the following processes:

a.) two or more pattern illumination-based annealings;

b.) plasma treatment comprising exposing said at least a portion of said coated substrate's pattern illumination-based annealed chemical coating to an ionized gas derived from the group consisting of He, Ne, Ar, Kr, Xe, $H_2$, $O_2$, $SF_6$, $CF_4$, $N_2$ and mixtures thereof;

c.) ion beam irradiation comprising exposing said at least a portion of said coated substrate's pattern illumination-based annealed chemical coating to an ion beam, said ion beam comprising an ionized gas derived from the group consisting of He, Ne, Ar, Kr, Xe, $H_2$, $O_2$, $SF_6$, $CF_4$, $N_2$ and mixtures thereof;

d.) electron beam illumination comprising exposing at least a portion of said coated substrate's pattern illumination-based annealed chemical coating to an electron dose of from about $10^2$ electrons/nm$^2$ to about $10^{25}$ electrons/nm$^2$;

e.) thermal annealing said at least a portion of said coated substrate's pattern illumination-based annealed chemical coating, said at least a portion of said coated substrate's pattern illumination-based annealed chemical coating's thermal annealing treatment temperature being from greater than about 250° C. to about 1,500° C.;

f.) chemically etching said at least a portion of said coated substrate's pattern illumination-based annealed chemical coating comprising contacting said at least a portion of said coated substrate's pattern illumination-based annealed chemical coating with an etching composition;

g.) electro-chemically treating said at least a portion of said coated substrate's pattern illumination-based annealed chemical coating by contacting said at least a portion of said coated substrate's pattern illumination-based annealed chemical coating with a chemical composition comprising an electrolyte and subjecting said contacted at least a portion of said coated substrate's pattern illumination-based annealed chemical coating and said chemical composition comprising an electrolyte to an electrical current;

h.) surface physical modification of at least a portion of said coated substrate's pattern illumination-based annealed chemical coating.

11. A process of making electrical device, an optical device or a combined electrical and optical device, said process comprising combining:

a) two or more electrical, an optical or a combined electrical and optical components produced according to the process of claim 1; or b) at least one electrical, optical or combined electrical and optical component produced according to the process of claim 1, and one or more additional electrical, optical or combined electrical and optical components.

12. A process according to claim 1 wherein at least a portion of said coated substrate's pattern illumination-based annealed chemical coating is further treated by at least one of the following processes:

a.) plasma treatment comprising exposing said at least a portion of said coated substrate's pattern illumination-based annealed chemical coating to an ionized gas derived from the group consisting of He, Ne, Ar, Kr, Xe, $H_2$, $O_2$, $SF_6$, $CF_4$, $N_2$ and mixtures thereof;

b.) ion beam irradiation comprising exposing said at least a portion of said coated substrate's pattern illumination-based annealed chemical coating to an ion beam, said ion beam comprising an ionized gas derived from the group consisting of He, Ne, Ar, Kr, Xe, $H_2$, $O_2$, $SF_6$, $CF_4$, $N_2$ and mixtures thereof;

c.) electron beam illumination comprising exposing at least a portion of said coated substrate's pattern illumination-based annealed chemical coating to an electron dose of from about $10^2$ electrons/nm$^2$ to about $10^{25}$ electrons/nm$^2$;

d.) chemically etching said at least a portion of said coated substrate's pattern illumination-based annealed chemical coating comprising contacting said at least a portion of said coated substrate's pattern illumination-based annealed chemical coating with an etching composition;

e.) electro-chemically treating said at least a portion of said coated substrate's pattern illumination-based annealed chemical coating by contacting said at least a portion of said coated substrate's pattern illumination-based annealed chemical coating with a chemical composition comprising an electrolyte and subjecting said contacted at least a portion of said coated substrate's pattern illumination-based annealed chemical coating and said chemical composition comprising an electrolyte to an electrical current;

f.) surface physical modification of at least a portion of said coated substrate's pattern illumination-based annealed chemical coating.

13. A process of making an electrical component, an optical component or a combined electrical and optical component according to claim 1 wherein said pattern of electrically conductive material electrodes comprise a pair of electrically conductive material electrodes that have a gap therebetween, and said gap is covered by said one or more chemical coatings, wherein said pattern illumination-based annealing comprises forming a crystallized region of said one or more chemical coatings over said gap.

14. A process for making a sensor or sensor array on a flexible substrate that has a first side and a second side, said process comprising:

1) a first unit operation where the flexible substrate is moved past a metal sputtering target, and said metal sputtering target deposits metal onto the first side of said flexible substrate to form an electrically conductive material coated substrate on a portion of said substrate;

2) a second unit operation where the electrically conductive material coated substrate is moved past a laser, and said laser patterns said electrically conductive material on said portion of said substrate to form patterned electrical conductive material on said substrate;

3) a third unit operation where the patterned electrically conductive material on said substrate is moved past a chemical coating sputtering target, and said chemical coating sputtering target applies a chemical coating in the form of a continuous film on top of said patterned electrical conductive material on said substrate to form a chemically coated substrate; and 4) a fourth unit operation, wherein the chemically coated substrate from the third unit operation is moved past a laser, wherein said laser anneals said chemically coated substrate to achieve at least one of a chemical change or change in crystallization in at least a portion of said continuous film.

* * * * *